United States Patent [19]
Hamasaki et al.

[11] Patent Number: 5,250,448
[45] Date of Patent: Oct. 5, 1993

[54] METHOD OF FABRICATING A MINIATURIZED HETEROJUNCTION BIPOLAR TRANSISTOR

[75] Inventors: Toshihiko Hamasaki, Yokohama; Hideki Satake, Kawasaki, both of Japan

[73] Assignee: Kabushiki Kaisha Toshiba, Kawasaki, Japan

[21] Appl. No.: 648,819

[22] Filed: Jan. 31, 1991

[30] Foreign Application Priority Data

Jan. 31, 1990 [JP] Japan .................. 2-18920
Nov. 14, 1990 [JP] Japan .................. 2-306054

[51] Int. Cl.⁵ .................. H01L 21/265; H01L 21/20
[52] U.S. Cl. .................. 437/31; 437/32; 437/126; 437/131; 437/132
[58] Field of Search .................. 437/31, 67, 126, 132, 437/87, 114, 37, 32; 148/DIG. 72, DIG. 96, DIG. 10, DIG. 11, DIG. 59; 357/16, 34

[56] References Cited

U.S. PATENT DOCUMENTS

| | | | |
|---|---|---|---|
| 4,551,911 | 11/1985 | Sasaki et al. | 437/67 |
| 4,683,487 | 7/1987 | Veyanagi et al. | 357/34 |
| 4,771,326 | 9/1988 | Curran | 357/34 |
| 4,889,831 | 12/1989 | Ishii et al. | 148/DIG. 10 |
| 4,954,457 | 9/1990 | Jambotkar | 437/31 |
| 4,958,201 | 9/1990 | Mimura | 357/34 |
| 4,983,532 | 1/1991 | Mitani et al. | 148/DIG. 72 |
| 4,997,776 | 3/1991 | Harame et al. | 437/13 |
| 5,001,534 | 3/1991 | Lunardi et al. | 357/34 |
| 5,006,476 | 4/1991 | De Jong et al. | 437/31 |
| 5,098,854 | 3/1992 | Kapoor et al. | 437/31 |

FOREIGN PATENT DOCUMENTS

| | | | |
|---|---|---|---|
| 3327301 | 3/1984 | Fed. Rep. of Germany . | |
| 60-95966 | 5/1985 | Japan | 437/31 |
| 63-116465 | 5/1988 | Japan . | |
| 0007501 | 2/1989 | Japan | 437/31 |
| 1-120059 | 5/1989 | Japan . | |
| 1-147863 | 7/1989 | Japan . | |
| 1-003932 | 1/1990 | Japan | 357/34 |

OTHER PUBLICATIONS

"Si/Si$_{1-x}$Ge$_x$ Heterojunction Bipolar Transistors Fabricated by Limited Reaction Processing", 1988 IEDM Digest of Technical Papers, p. 566, J. F. Gibbons et al.
"SiGe-Base, Poly-Emitter Heterojunction Bipolar Transistors", 1989 Symp. on VLSI Digest of Technical Papers, pp. 95-96, G. L. Patton et al.

(List continued on next page.)

Primary Examiner—Olik Chaudhuri
Assistant Examiner—Loc Q. Trinh
Attorney, Agent, or Firm—Oblon, Spivak, McClelland, Maier & Neustadt

[57] ABSTRACT

A heterojunction bipolar transistor of this invention is a miniaturized heterojunction bipolar transistor wherein at least one of an emitter layer and a collector layer is formed of a semiconductor material having a wider band gap than a material of a base layer. A method of fabricating the transistor includes the steps of forming a first semiconductor layer of a first conductivity type on a substrate, which first semiconductor layer serves as a collector layer, etching an unnecessary portion of the first semiconductor layer to form a groove, and burying an insulating layer in the groove, forming a second semiconductor layer serving as a base layer on the first semiconductor layer and that part of the insulating layer surrounding the first semiconductor layer, and forming a third semiconductor layer of the first conductivity type, serving as an emitter layer, on the second semiconductor layer. According to the method of this invention, a groove is formed, in advance, in an unnecessary part of the first semiconductor layer, which becomes the collector layer, and the insulating layer is buried in the groove. Thus, a flattened wafer having an element region defined therein can be obtained. The second semiconductor layer which becomes the base layer is formed on the wafer, following which the third semiconductor layer serving as the emitter layer is formed. Thus, the base-collector junction area can be reduced to a minimum necessary value. In addition, the surface with a small stepped portion can be obtained.

16 Claims, 22 Drawing Sheets

OTHER PUBLICATIONS

"A 45 GH% Strained-Layer SiGe Heterojunction Bipolar Transistor Fabricated With Low Temperature EPI", 1989 IEDM Digest of Technical Papers, pp. 890-892, S. E. Fischer et al.

"Fully Self-Aligned Heterjunction Bipolar Function Transistor", IBM Technical Disclosure Bulletin, pp. 61-68, vol. 31 No. 7, 1988.

IEEE Electron Device Letters, vol. 10, No. 11, Nov. 1989, pp. 503-505, T. I. Kamins, et al., "Small-Geometry, High Performance, Si—Si$_{1-x}$Ge$_x$ Heterojunction Bipolar Transistors".

Electronics, Apr. 7, 1986, pp. 24-28, B. C. Cole, "Special Report: VLSI Give Bipolar A Second Wind".

IEEE Electron Device Letters, vol. EDL-5, No. 11, Nov. 11, 1984, pp. 449-451, T. I. Kamins, et al., "Trench-Isolated Transistors In Lateral CVD Epitaxial Silicon-On-Insulator Films".

IBM Technical Disclosure Bulletin, vol. 26, No. 9, Feb., 1984, pp. 4699-4701, B. El-Kareh, et al., "Trench Node One-Device Memory Cell Process".

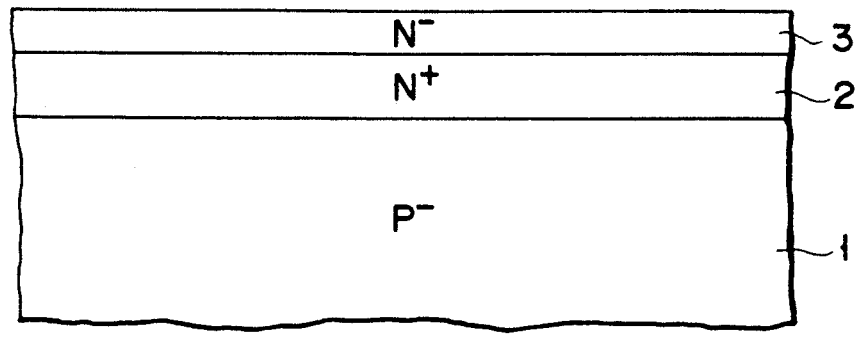
F I G. 1A
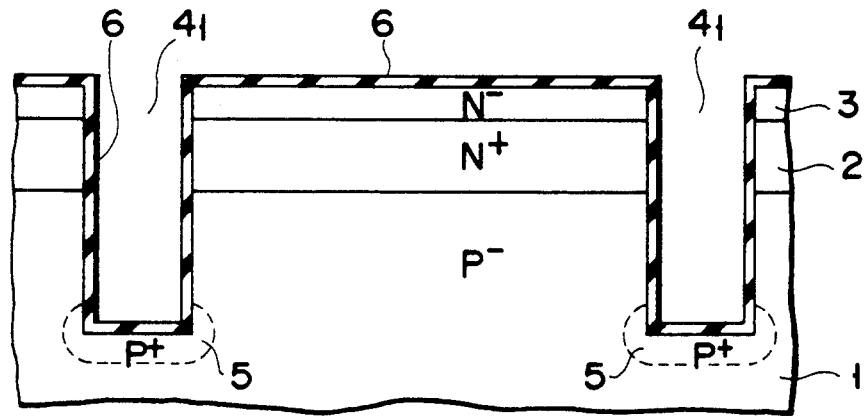
F I G. 1B
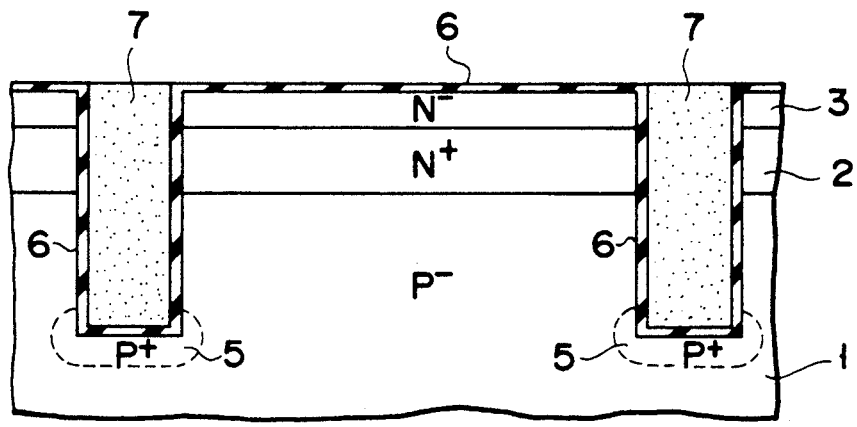
F I G. 1C

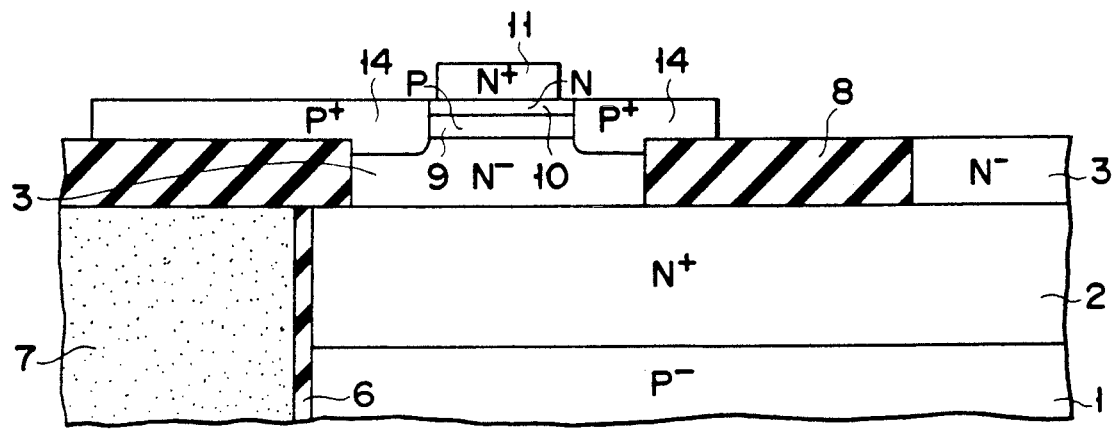
F I G. 1J
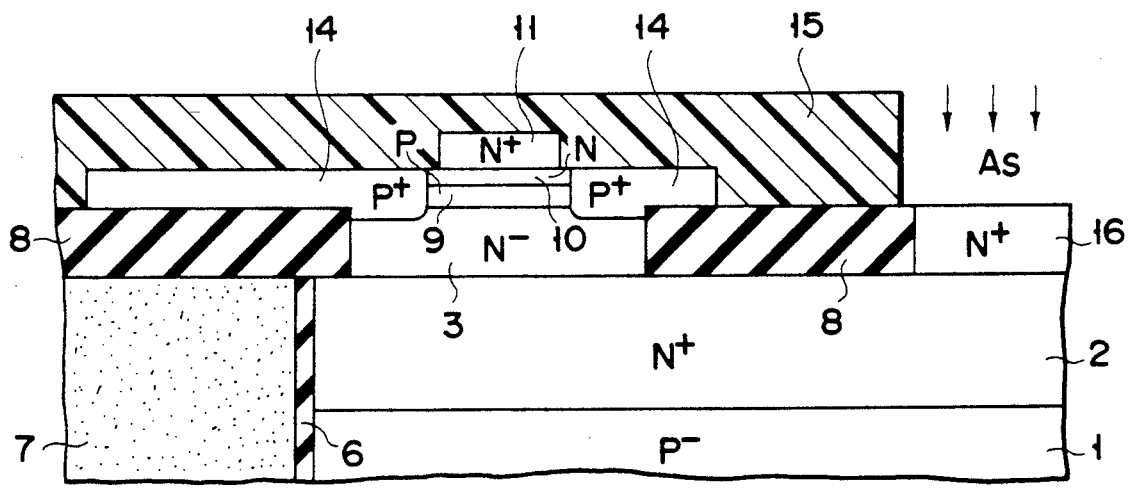
F I G. 1K

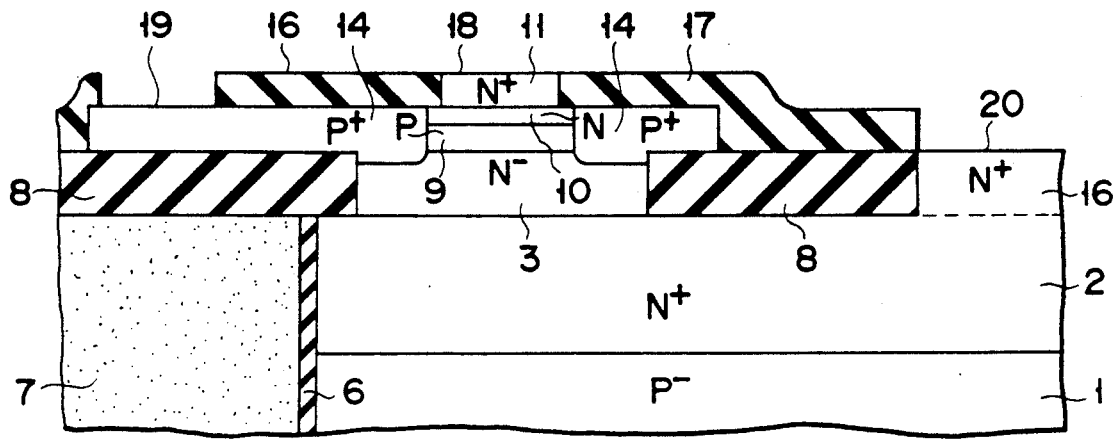
F I G. 1L
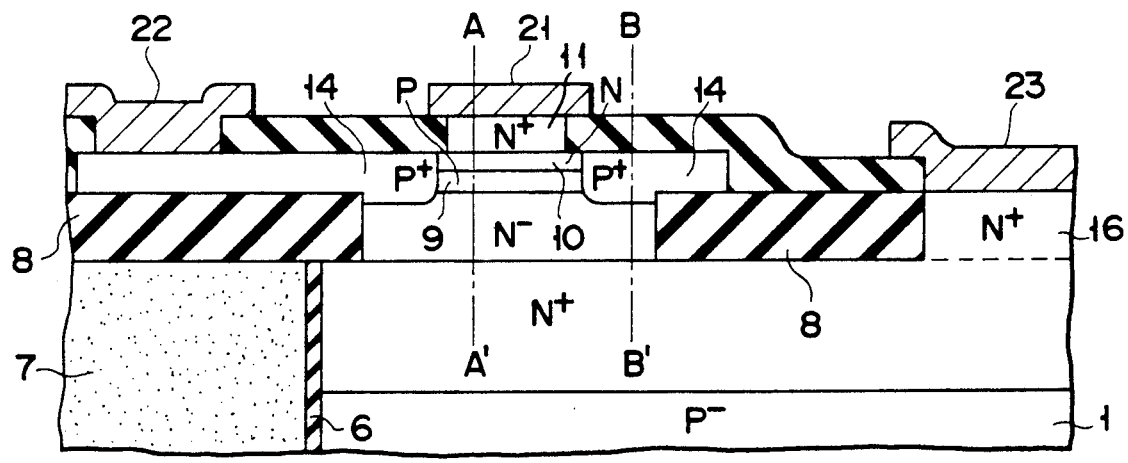
F I G. 1M

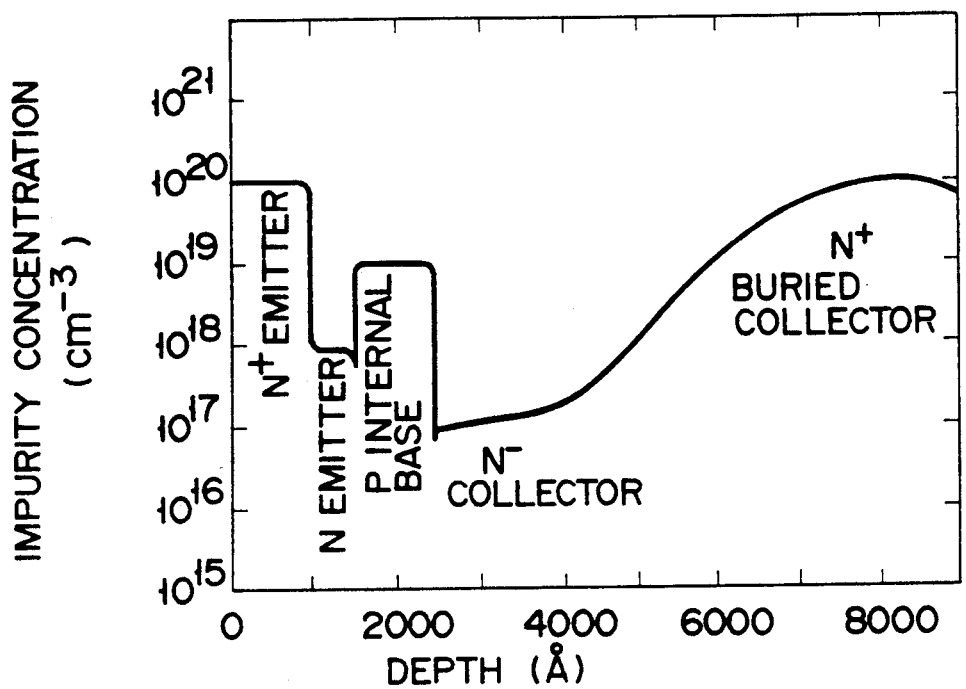
F I G. 2
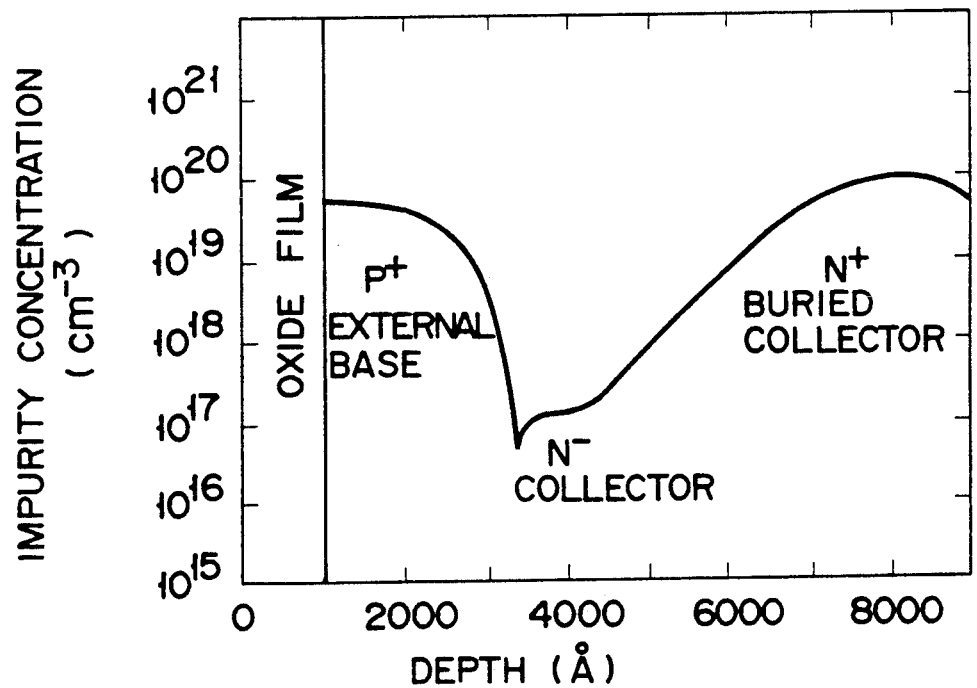
F I G. 3

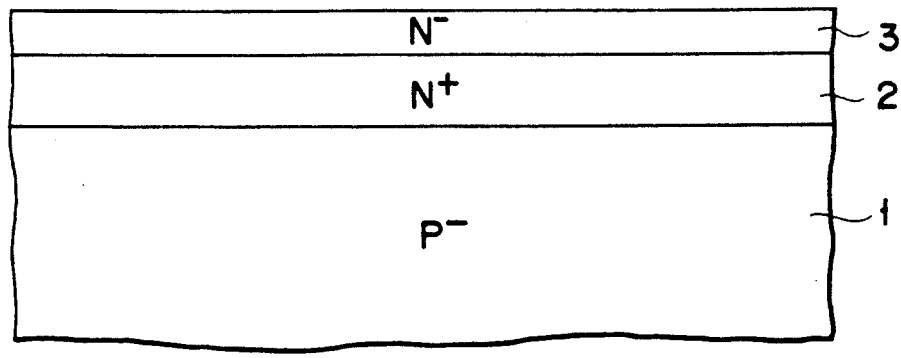
F I G. 5A
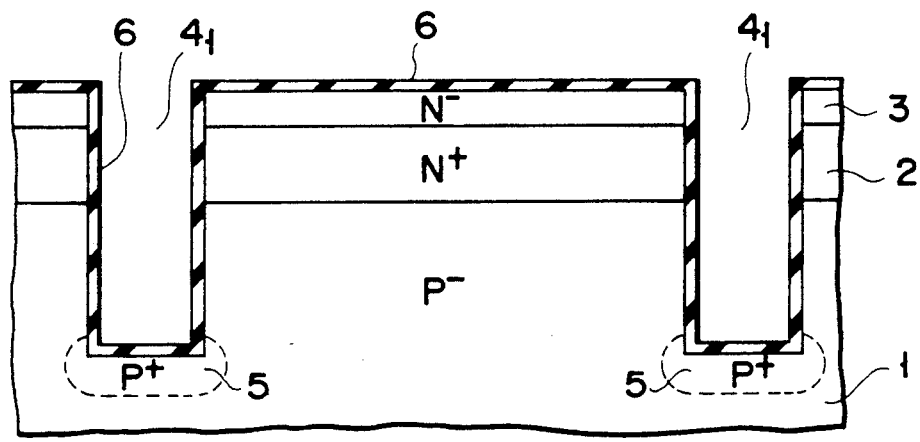
F I G. 5B
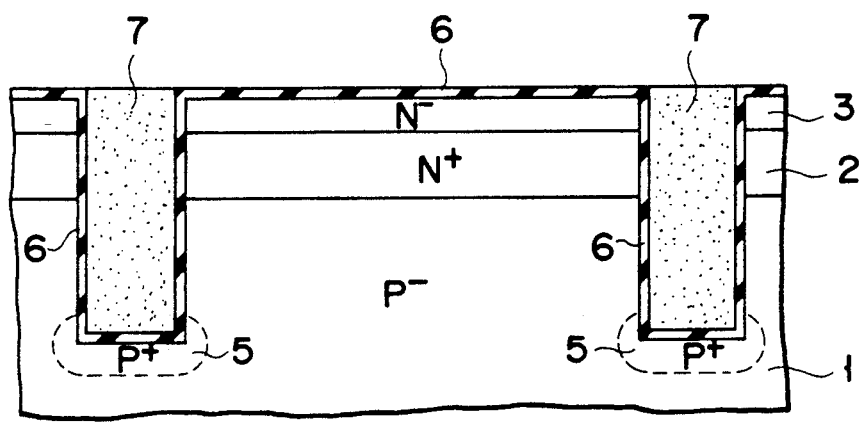
F I G. 5C

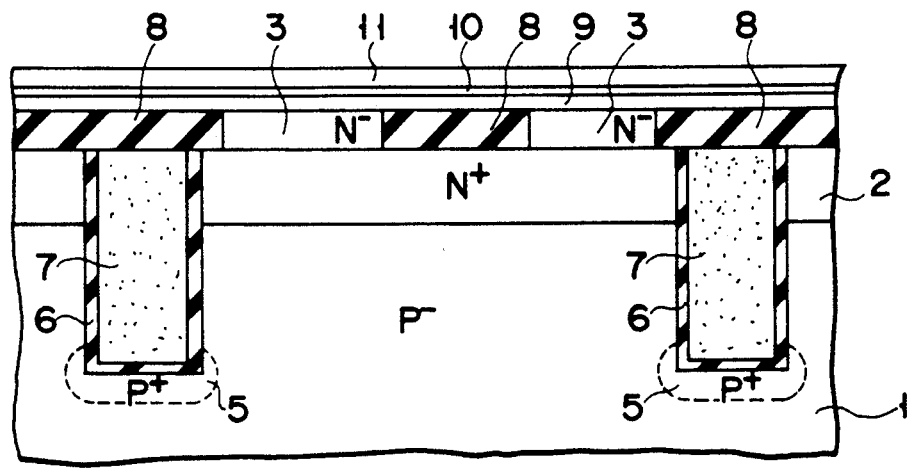
F I G. 5G
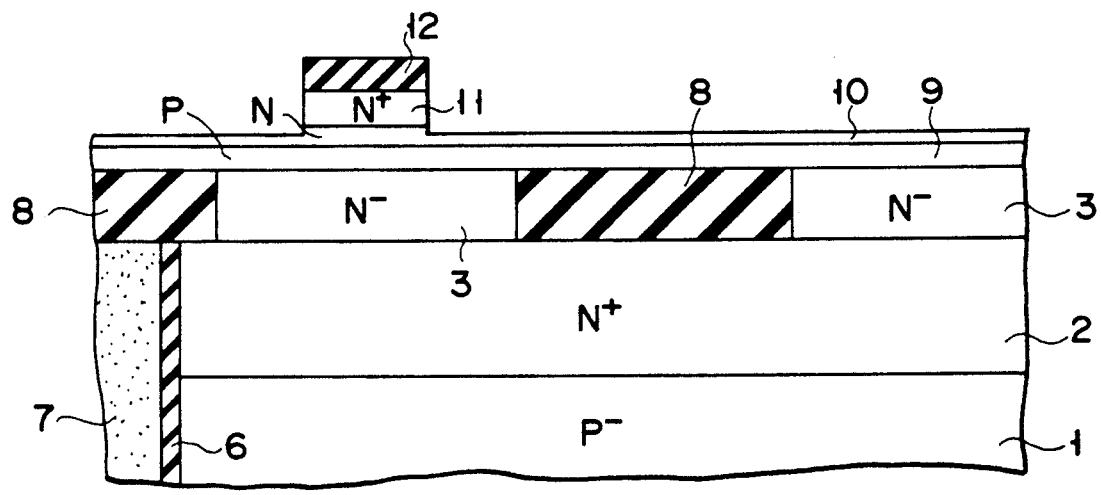
F I G. 5H
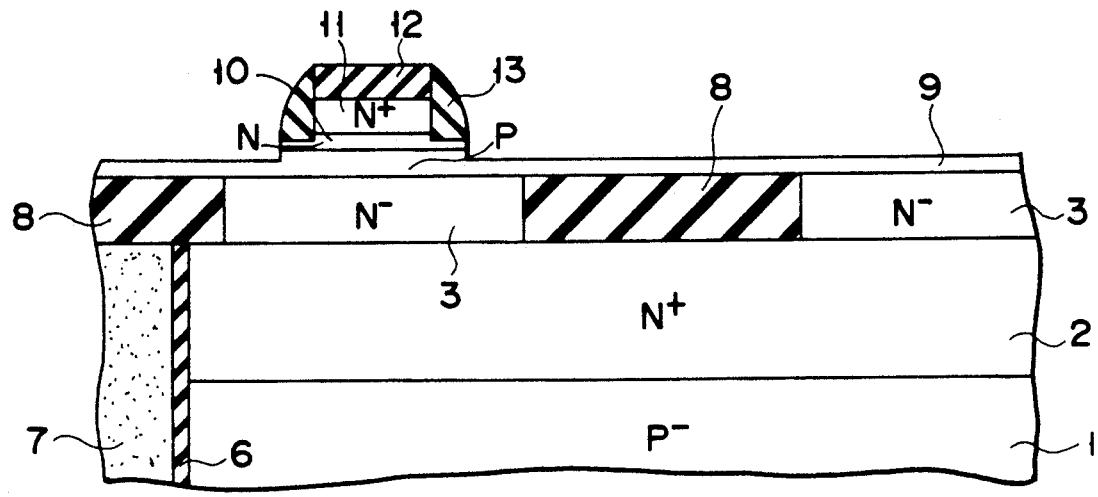
F I G. 5I

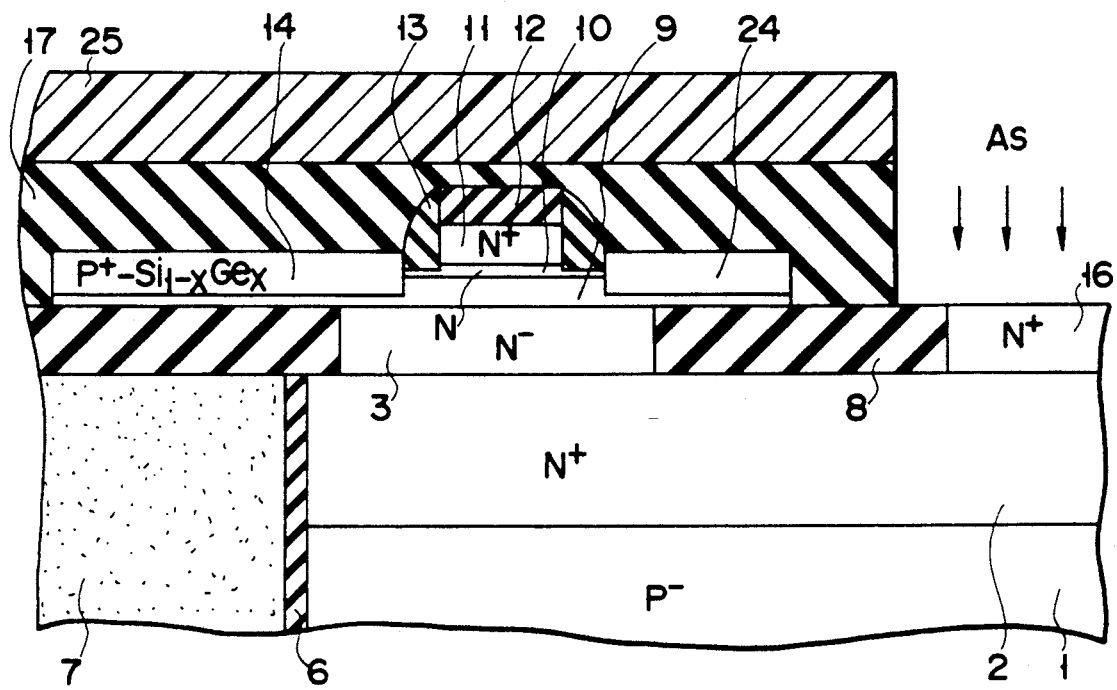
F I G. 5L
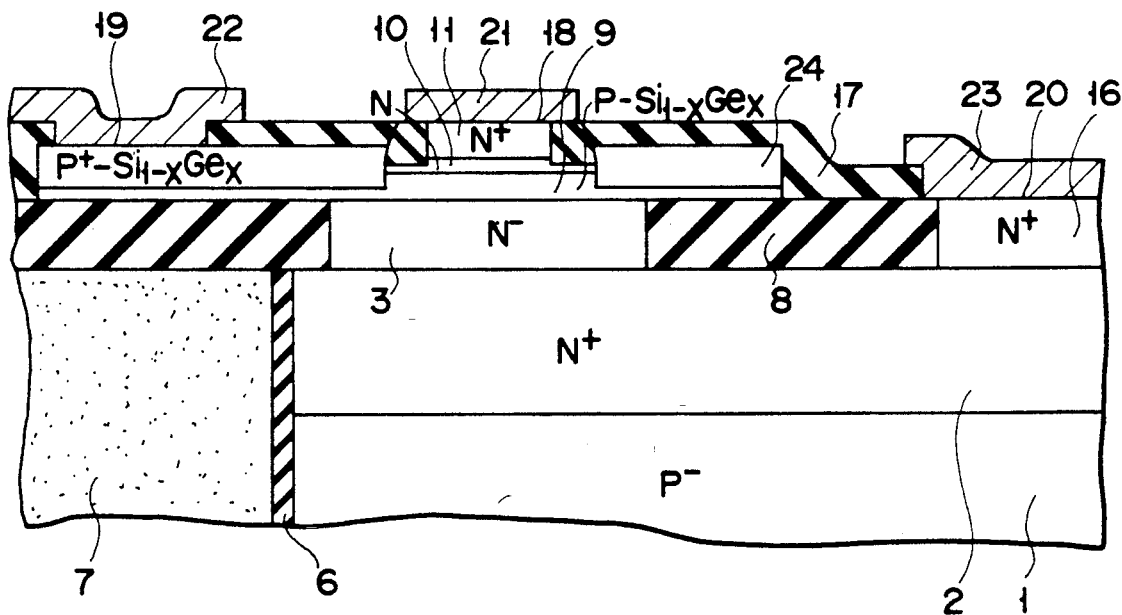
F I G. 5M

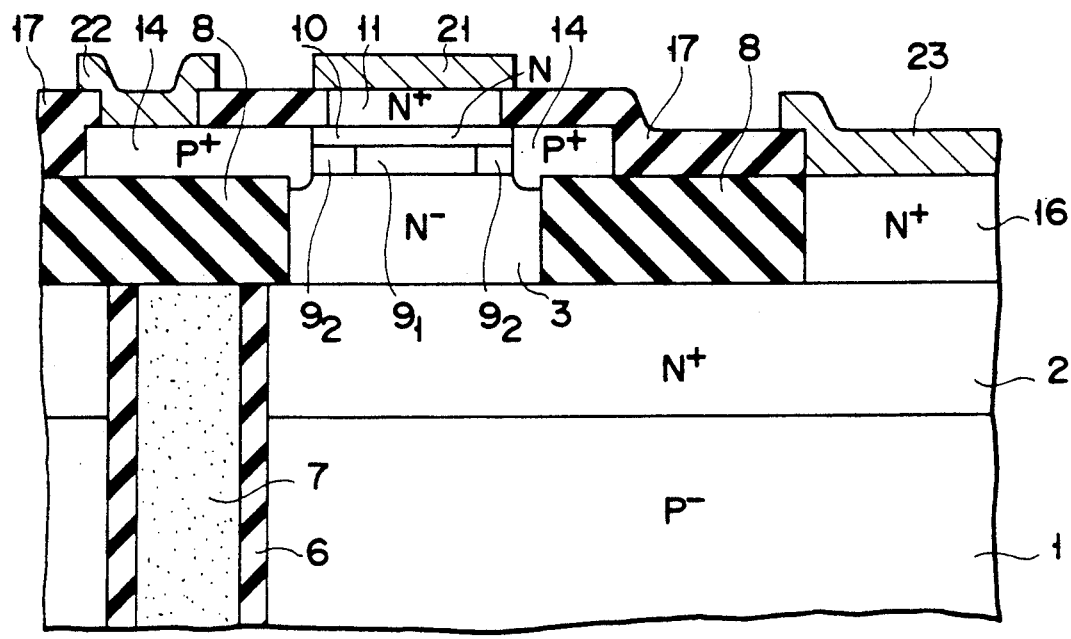
F I G. 8
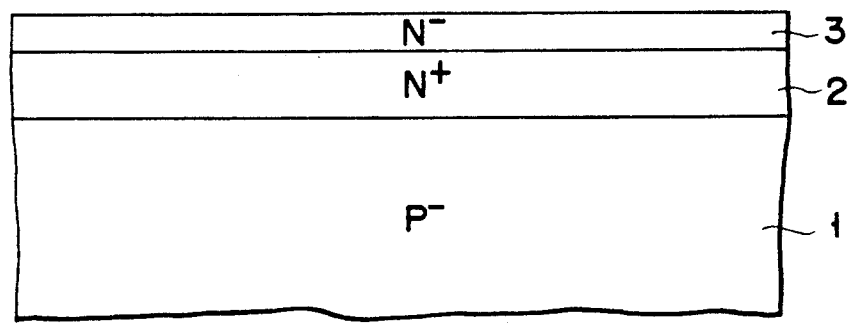
F I G. 9A
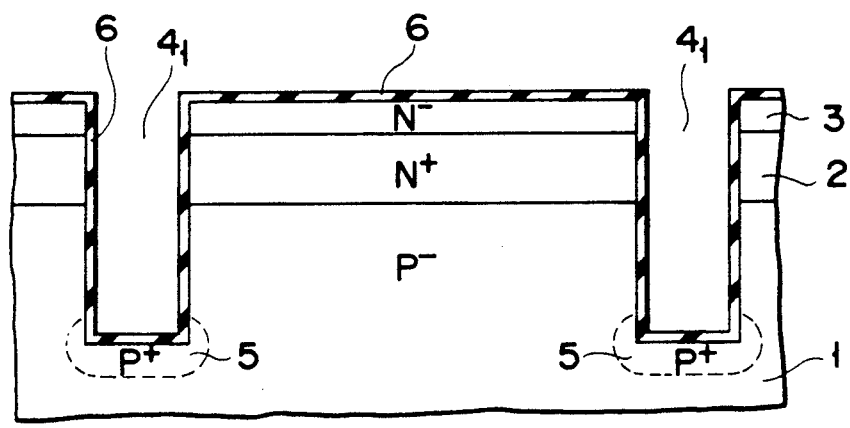
F I G. 9B

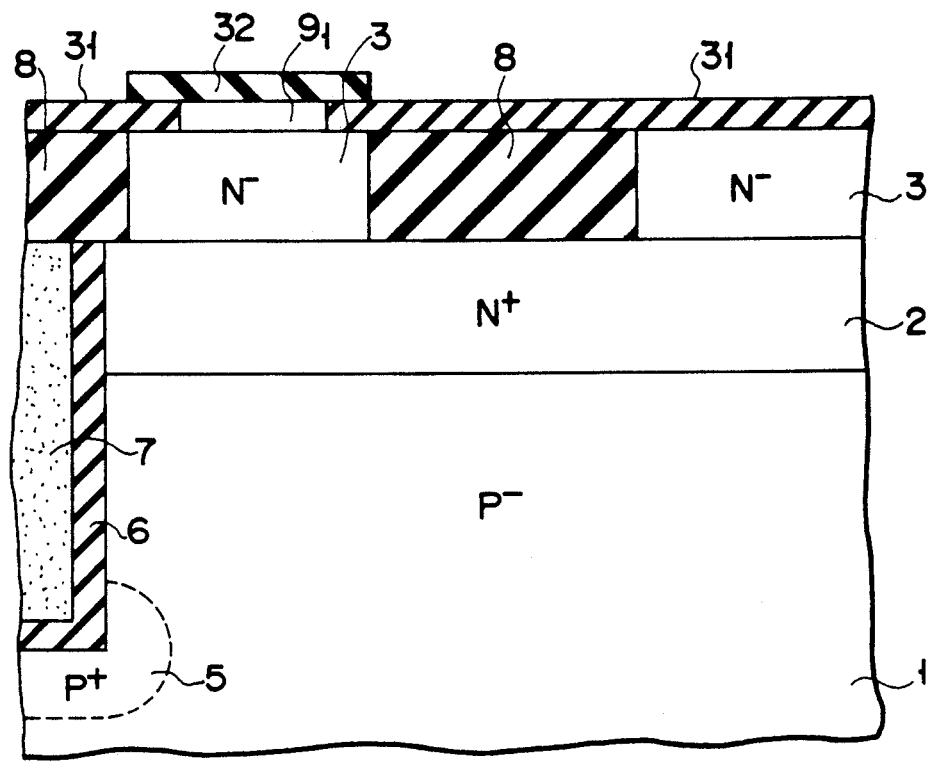
F I G. 9H
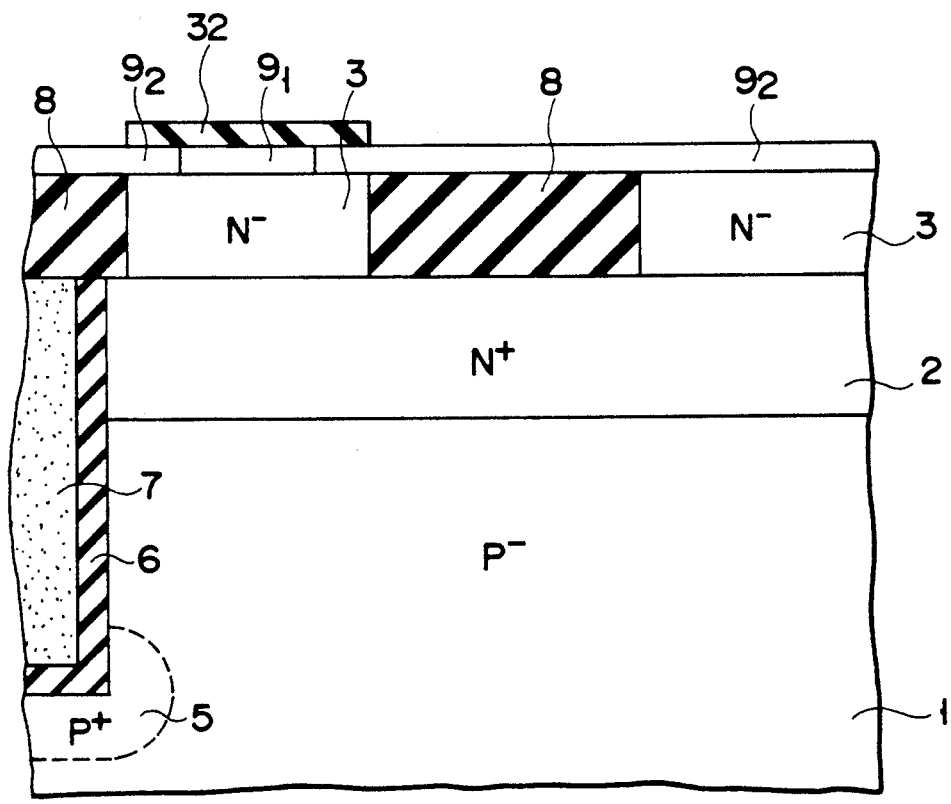
F I G. 9I

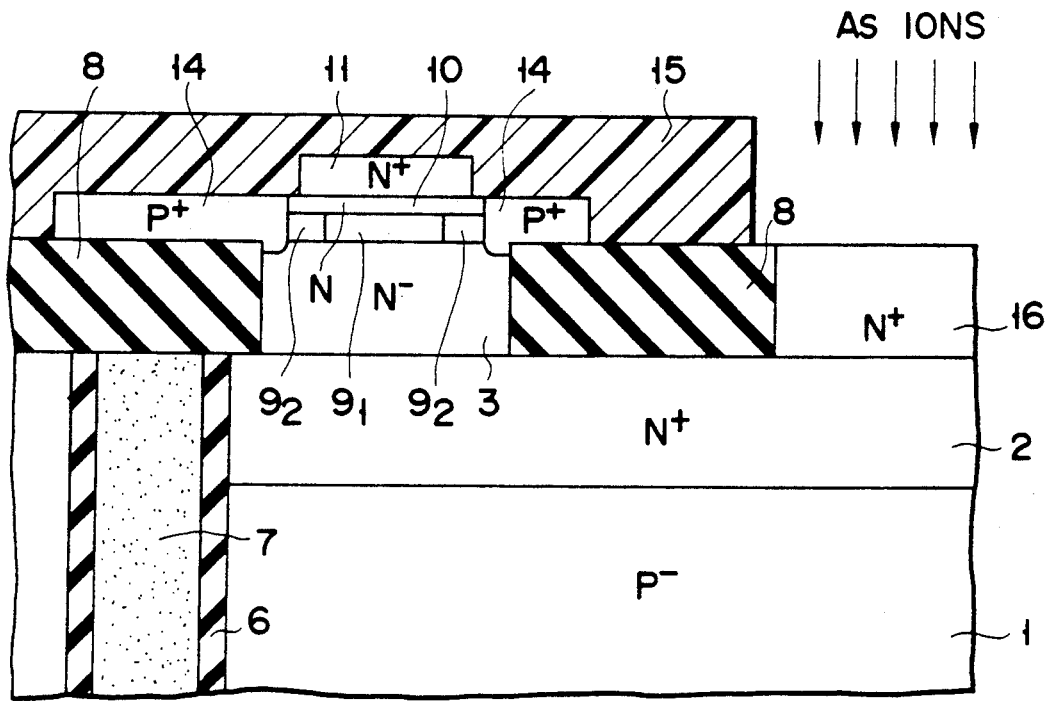
F I G. 9L
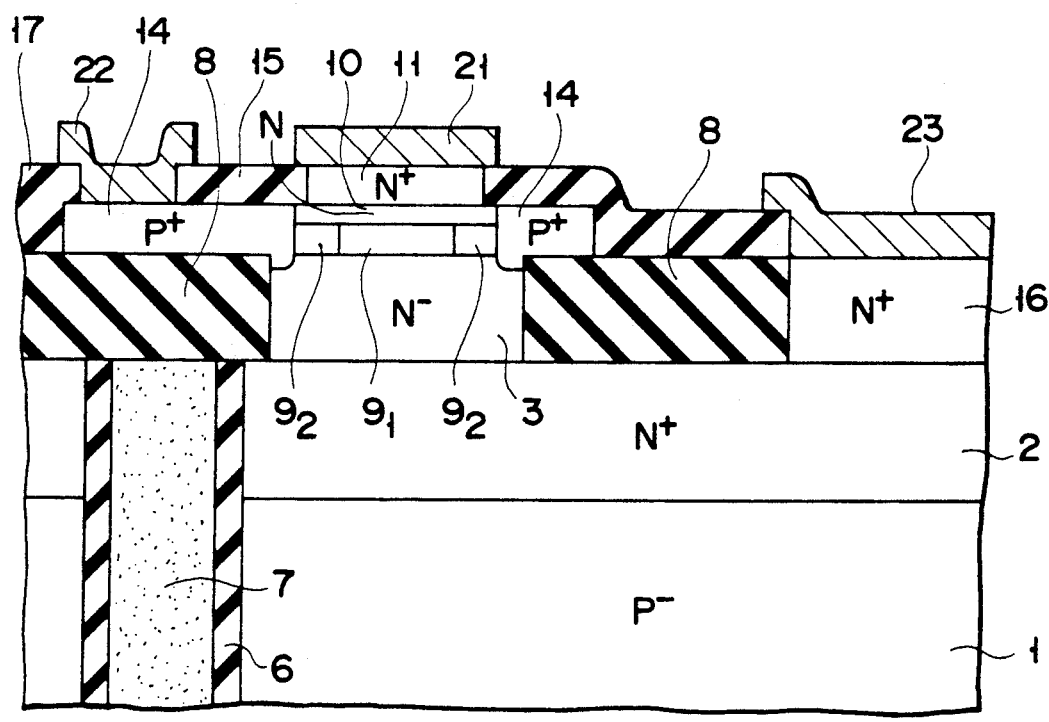
F I G. 9M

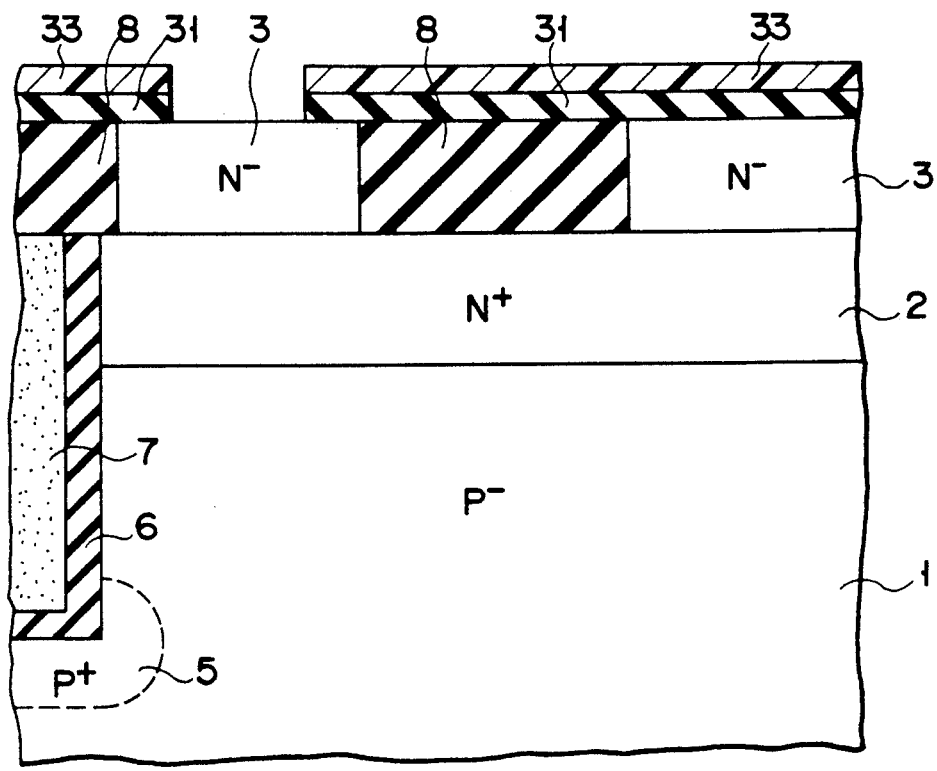
F I G. 11A
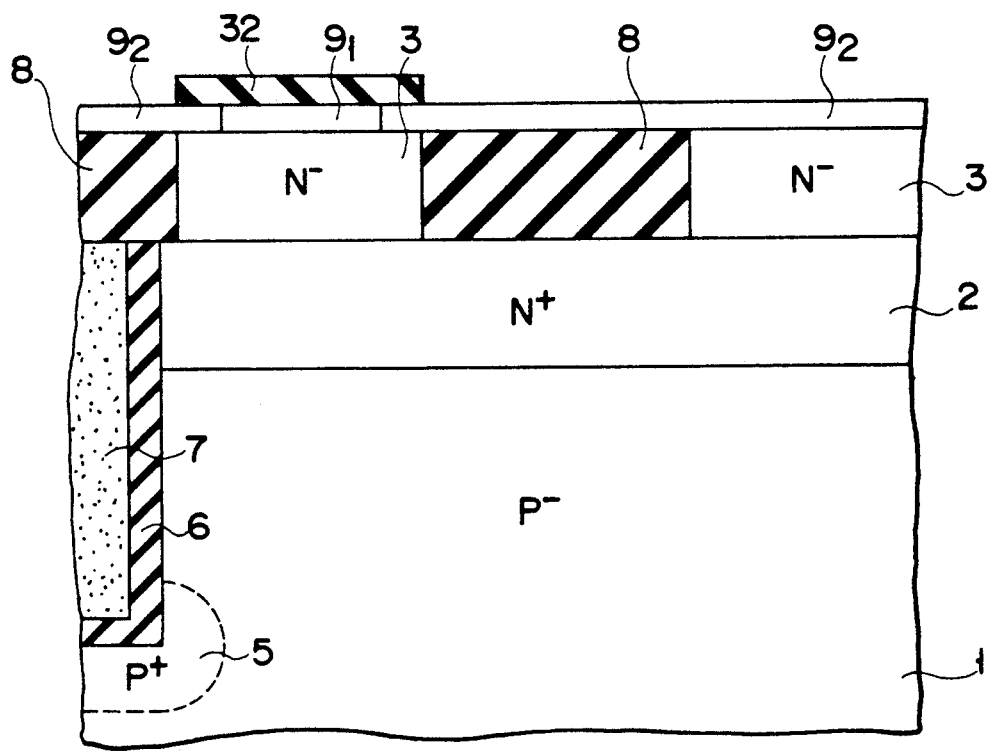
F I G. 11B

METHOD OF FABRICATING A MINIATURIZED HETEROJUNCTION BIPOLAR TRANSISTOR

BACKGROUND OF THE INVENTION

1. Field of the Invention

The present invention relates to a method of fabricating a miniaturized heterojunction bipolar transistor wherein at least one of an emitter layer and a collector layer is formed of a semiconductor material having a greater band gap than a material of a base layer.

2. Description of the Related Art

Recently, heterojunction bipolar transistors have been regarded as high-performance transistors, and, in particular, heterojunction bipolar transistors using a compound semiconductor have been widely studied. The study for the technique of incorporating a heterojunction in a silicon-based bipolar transistor has been progressing. Silicon-based heterojunction bipolar transistors are disclosed, for example, in (1) 1988, IEDM Digest of Technical Papers, p. 566, J. F. Gibbons et al. and (2) 1989, Symp. VLSI Tech. Digest of Technical Papers, p. 95, G. L. Patton et al. In these documents, it is shown that a base layer is formed of a silicon germanium alloy layer (SiGe layer), which is a strained epitaxial layer having a smaller band gap than silicon.

The conventional silicon-based heterojunction bipolar transistor has the following drawbacks. In the device of document (1), a junction area between an external base layer and a collector layer is large, and a collector-base junction capacitance is large. This makes it impossible for a transistor to operate at high speed. In the device of document (2), an element region is defined by an insulating film, and thereby a base-collector junction capacitance is made smaller than in the case of document (1). In the device of document (2), however, a large stepped portion is produced in the emitter region, and the possibility of breakage of electrode wiring must be taken into consideration. In addition, the external base layer and the emitter layer formed of polycrystalline silicon do not have a self-aligned structure. Consequently, it becomes difficult to control the distance between the external base layer and the emitter layer, and the increase in this distance raises the base resistance.

SUMMARY OF THE INVENTION

An object of the present invention is to provide a method of fabricating a high-performance miniaturized heterojunction bipolar transistor wherein a collector-base junction capacitance is low and a high-speed switching operation is possible.

Another object of this invention is to provide a method of fabricating a high-performance miniaturized heterojunction bipolar transistor wherein a stepped portion on an element region is small and high reliability is attained.

A heterojunction bipolar transistor of this invention is a miniaturized heterojunction bipolar transistor wherein at least one of an emitter layer and a collector layer is formed of a semiconductor material having a wider band gap than a material of a base layer, and a method of fabricating the transistor comprises the steps of: forming a first semiconductor layer of a first conductivity type on a substrate, said first semiconductor layer serving as a collector layer; etching an unnecessary portion of the first semiconductor layer to form a groove, and burying an insulating layer in the groove; forming a second semiconductor layer serving as a base layer on the first semiconductor layer and that part of the insulating layer surrounding the first semiconductor layer; and forming a third semiconductor layer of the first conductivity type, serving as an emitter layer, on the second semiconductor layer.

According to the method of this invention, a groove is formed, in an advance, in unnecessary part of the first semiconductor layer, which becomes the collector layer, and the insulating layer is buried in the groove. Thus, a flattened wafer having an element region defined therein can be obtained. The second semiconductor layer which becomes the base layer is formed on the wafer, following which the third semiconductor layer serving as the emitter layer is formed. Thus, the base-collector junction area can be reduced to a minimum necessary value. In addition, the surface with a small stepped portion can be obtained. Thus, the high performance and high reliability of the miniaturized heterojunction bipolar transistor can be ensured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1M are cross-sectional views illustrating a process of fabricating a heterojunction bipolar transistor according to an embodiment of the present invention;

FIG. 2 is a graph showing an impurity concentration distribution in a cross section taken along line A-A' in FIG. 1M;

FIG. 3 is a graph showing an impurity concentration distribution in a cross section taken along line B-B' in FIG. 1M;

FIGS. 5A to 5M are cross-sectional views illustrating the method of manufacturing the transistor show in FIG. 4;

FIG. 8 is a cross-sectional view showing a heterojunction bipolar transistor according to still another embodiment of the invention;

FIGS. 9A to 9M are cross-sectional views illustrating the method of fabricating the transistor shown in FIG. 8;

FIGS. 11A and 11B are cross-sectional views illustrating the method of fabricating a heterojunction bipolar transistor according to still another embodiment of the invention;

DETAILED DESCRIPTION OF THE PREFERRED EMBODIMENTS

Figure 1D:
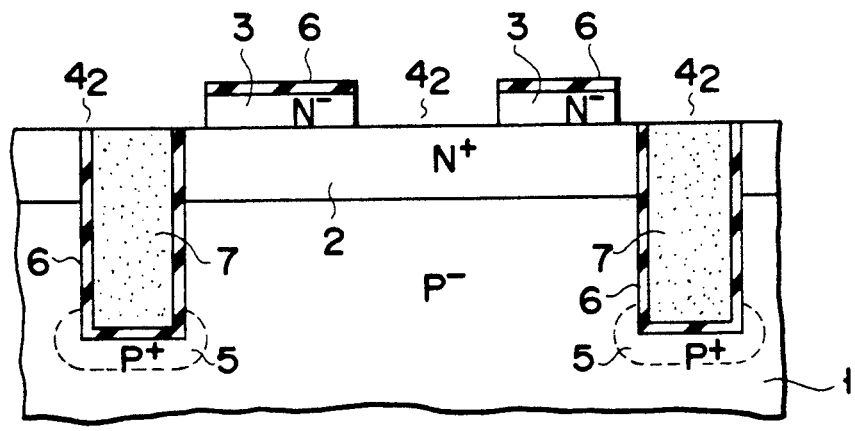

An embodiment wherein the present invention is applied to a Si/SiGe heterojunction bipolar transistor will now be described with reference to FIGS. 1A to 1M. Arsenic (As) is doped in a surface portion of a $P^-$-type silicon monocrystalline substrate 1 to form an $N^+$-type layer 2 which becomes a collector buried layer. Then, an $N^-$-type layer 3 which becomes a collector layer is grown on the layer 2 (FIG. 1A). The thickness of the $N^-$-type layer 3 is 4000 Å. Using a photoresist mask (not shown), reactive ion etching (RIE) is performed to etch selected portions of the $N^-$-type layer 3 and $N^+$-type layer 2, thereby forming a groove $4_1$ in an element separating region. The groove 41 is so formed as to reach the substrate 1. A silicon oxide film 6 is formed, by means of thermal oxidation, on the inner wall of the groove $4_1$ and on the surface of the $N^-$-type layer 3. A $P^+$-type inversion-preventing layer 5 (FIG. 1B) is formed at the bottom of the groove $4_1$ by means of ion-implantation of boron ions (FIG. 1B). Thereafter, an undoped polycrystalline silicon layer 7 is filled in the element separating groove $4_1$ (FIG. 1C).

Figure 1E:
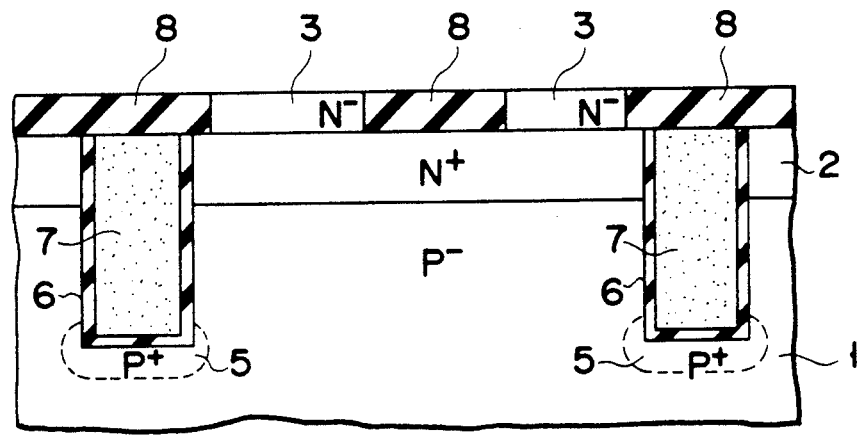

The $N^-$-type layer 3, excluding the portion necessary as an element region and a collector lead-out region, is removed by means of selective etching, thus forming a groove $4_2$ (FIG. 1D). A silicon oxide film is deposited on the entire surface of the resultant structure by means of chemical vapor deposition (CVD). After the surface of the resultant structure is flattened by use of a photoresist, etc., the silicon oxide film is etched. Thus, a silicon oxide film 8 is buried in the groove $4_2$. Then, the silicon oxide film 6 on the surface of the $N^-$-type layer 3 is removed by etching (FIG. 1E). In this manner, a flat-structured wafer is obtained, wherein the $N^-$-type layer 3 is left in the emitter formation region and the collector lead-out region and the insulating layer is buried in the other region.

Figure 1F:
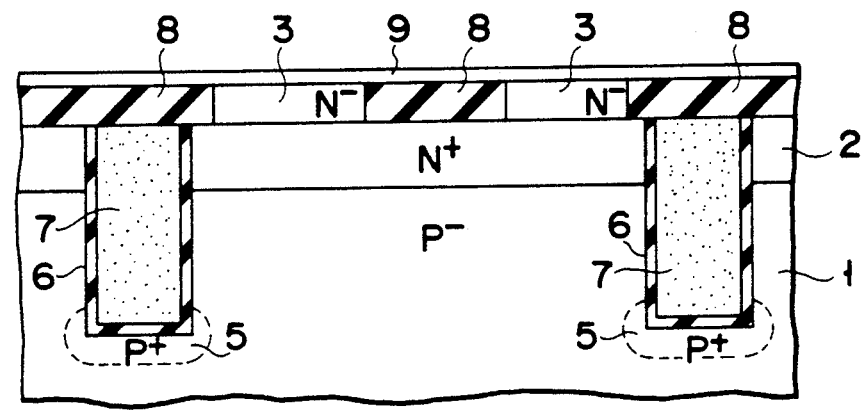
Figure 1G:
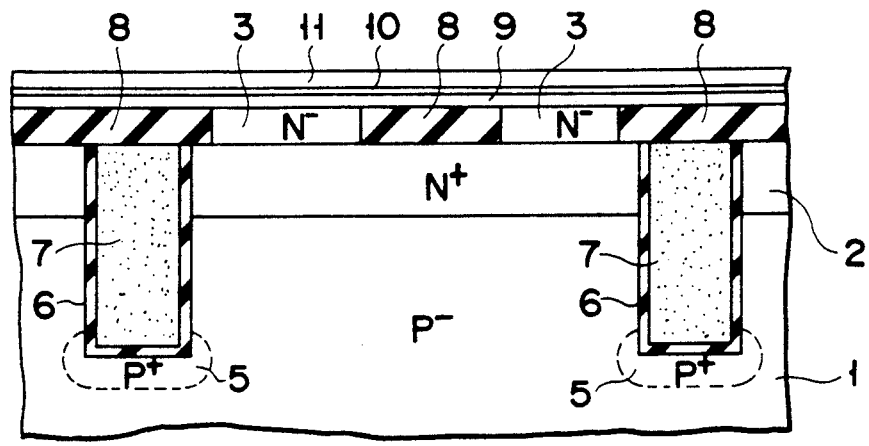

A P-type SiGe layer 9, which becomes a base layer, is epitaxially grown on the $N^-$-type layer 3 and the silicon oxide layer 8, which surrounds the layer 3, of the flat wafer (FIG. 1F). In the step of forming the SiGe layer 9, for example, molecular beam epitaxy (MBE) is carried out to simultaneously doping boron (B) simultaneously with the growth of the layer 9. Thus, the P-type SiGe layer 9 which is a strained epitaxial layer containing 20% of Ge is formed. The B concentration in the SiGe layer 9 is about $1 \times 10^{19}/cm^3$. Subsequently, an N-type silicon layer 10, which has a thickness of 500 Å and becomes an emitter layer, and an $N^+$-type silicon layer 11, which has a thickness of 1000 Å and becomes an emitter-contact layer, are epitaxially grown successively (FIG. 1G). For example, the As concentration in the n-type silicon layer 10 is $1 \times 10^{18}/cm^3$, and the As concentration in the $N^+$-type silicon layer 11 is $1 \times 10^{20}/cm^3$.

Figure 1H:
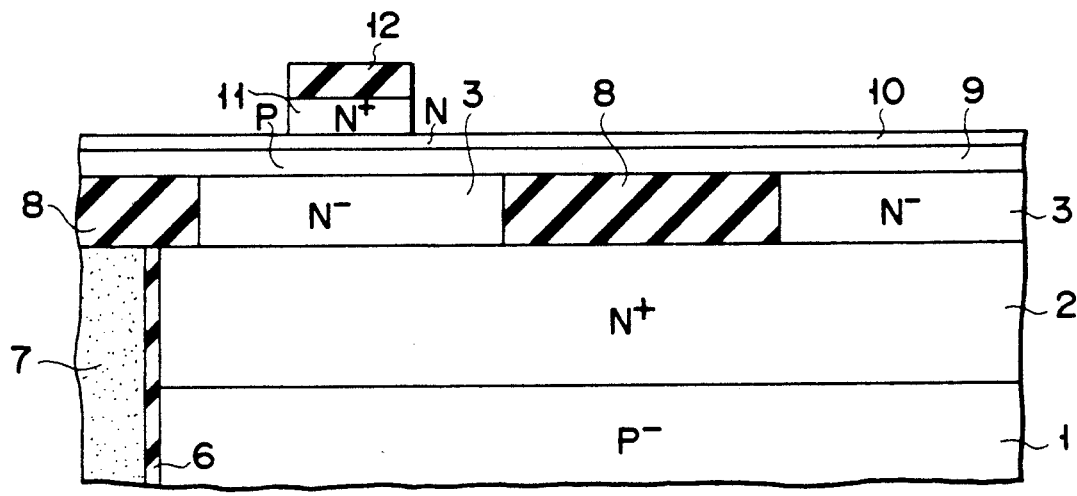
Figure 1I:
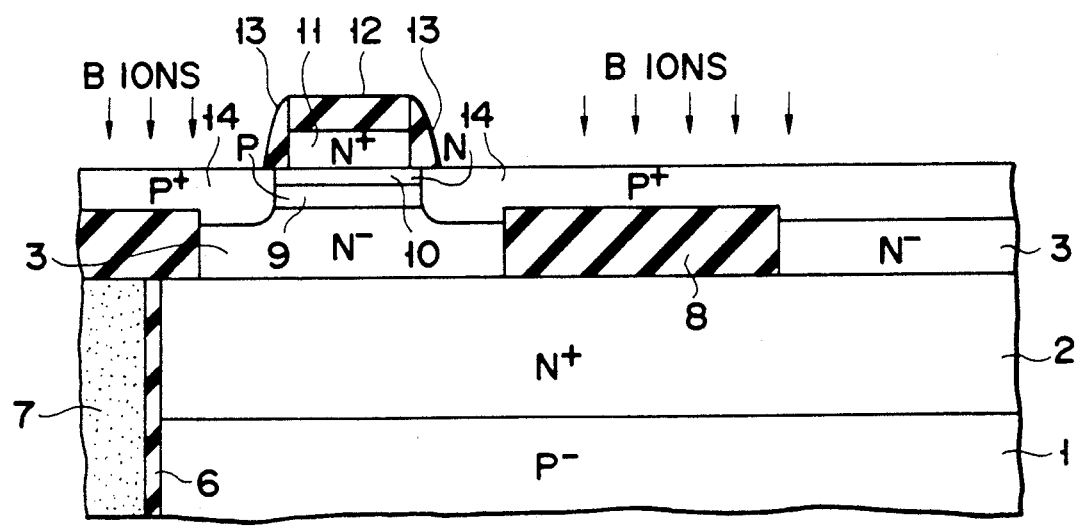

A silicon oxide film 12 is deposited on the resultant structure by means of CVD. Using a photoresist mask (not shown), RIE is performed to remove the film 12 except its part corresponding to the emitter region. Subsequently, the $N^+$-type silicon layer 11 is selectively removed (FIG. 1H). In the figures after FIG. 1H, important portions are enlarged. Then, a silicon oxide film 13 is deposited on the resultant structure by means of CVD, and it is etched by RIE, thereby leaving only part of the film 13 on the side walls of the silicon oxide film 12 and $N^+$-type silicon layer 11. Using the silicon oxide films 12 and 13 as a mask, B is ion-implanted and thereby a $P^+$-layer 14, which becomes an external base layer reaching the $N^-$-type layer 3 and the oxide film 8, is formed (FIG. 1I). Then, the silicon oxide films 12 and 13 are removed by etching. Using a photoresist mask (not shown) patterned to cover the emitter region and the base formation region, the unnecessary part of the $P^+$-type layer 14 is removed (FIG. 1J). That part of the patterned $P^+$-type layer 14, which is surrounded by the silicon oxide film 8, functions as an external base layer, and that part of the layer 14, which extends over the silicon oxide film 8, functions as a base lead-out electrode.

The emitter and base regions are covered with a photoresist mask 15, and As is implanted, thereby forming an $N^+$-type collector lead-out layer 16 reaching the $N^+$-type layer 2 (FIG. 1K). After the photoresist mask 15 is removed, a silicon oxide film 17 is deposited on the resultant structure by means of CVD. The film 17 is selectively etched to form an emitter electrode contact opening 18, a base electrode contact opening 19 and a collector electrode contact opening 20 (FIG. 1L). Finally, metallic electrodes 21, 22 and 23 of Al, etc. are formed (FIG. 1M).

FIGS. 2 and 3 show impurity concentration distributions, respectively, in cross sections taken along lines A-A' and B-B' in FIG. 1M.

As has been described above, according to this embodiment, a groove is formed in the unnecessary part of the wafer in which the N-type Si layer 3, which becomes a collector layer, is formed, and the oxide film 8 is buried in the groove and thereby the surface of the wafer is flattened. The SiGe layer 9, which becomes the base layer, and the Si layer 10, which becomes the emitter layer, are epitaxially grown successively. Since the region necessary for the emitter and base of the element is defined by the buried oxide film, the base-collector junction capacitance does not increase excessively. An excellent flatness of the wafer can be kept from the initial stage to the final stage of the manufacturing process, and the electrode lead-out portions do not have a large stepped portion. In addition, the external base region is self-aligned with respect to the emitter region and is formed very close to the emitter region. Thus, a low base resistance is attained. Accordingly, a small-sized heterojunction bipolar transistor with high performance and high reliability can be obtained.

Figure 4:
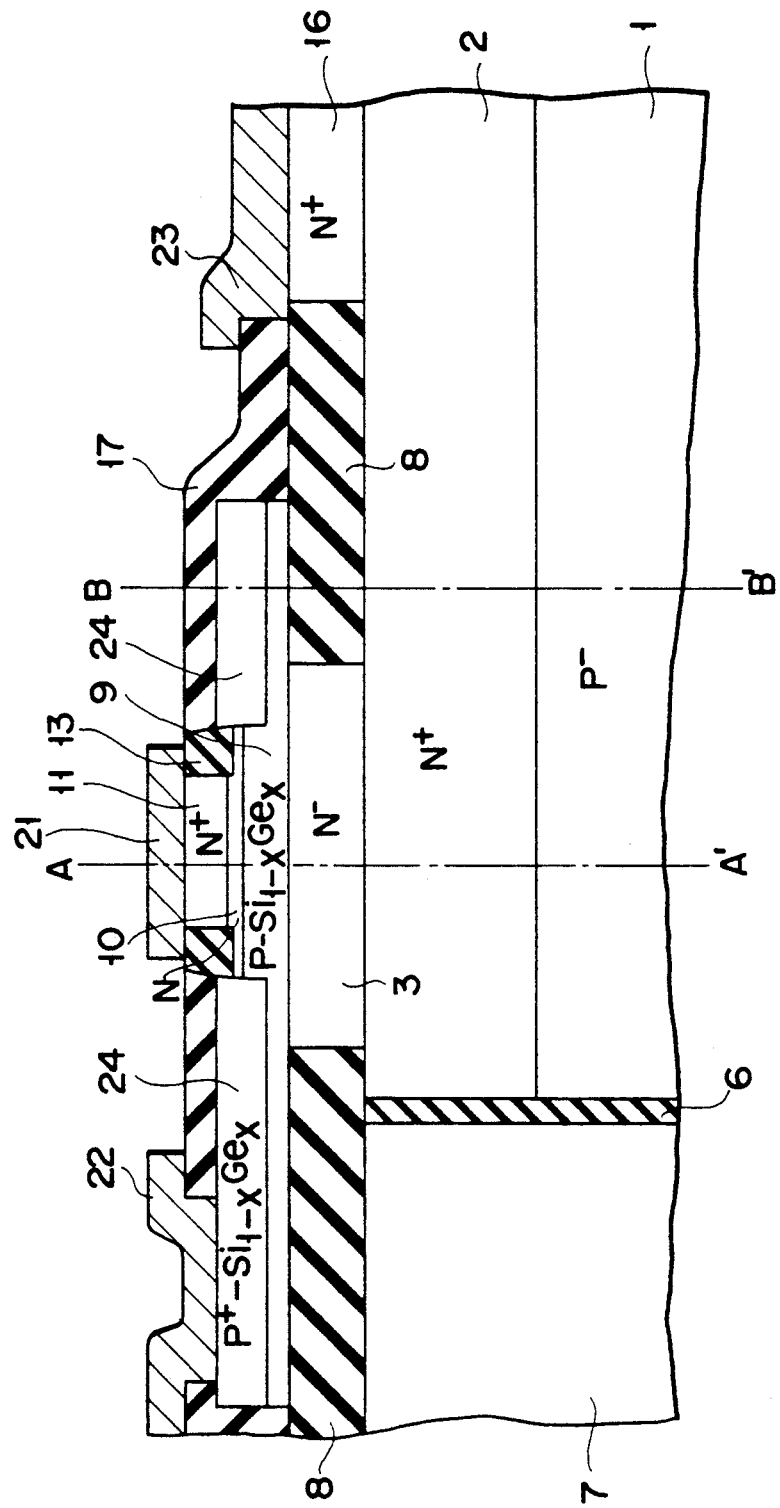
FIG. 4 is a cross-sectional view showing a heterojunction bipolar transistor according to another embodiment of the invention.

FIG. 4 shows a heterojunction bipolar transistor according to another embodiment of the invention. In the above-described embodiment, the entire base region including an internal base layer (an active base layer) and an external base layer is formed of a SiGe layer of the same composition. Thus, both internal base layer and external base layer have the same band gap, and it is difficult to reduce the resistance of the external base layer sufficiently. The embodiment shown in FIG. 4 aims at reducing the resistance of the external base layer. The structural parts common to those shown in FIG. 1M are denoted by like reference numerals, and a detailed description thereof is omitted. In the present embodiment, that part of a P-type SiGe layer 9, which does not correspond to the region serving as an internal base layer, is etched to a predetermined depth, and a P+-type SiGe layer 24 serving as an external base layer is formed on the etched part by means of selective epitaxial growth. The P+-type SiGe layer 24 serving as the external base layer is thicker than the P-type SiGe layer 9 serving as the internal base layer and the layer 24 has a Ge concentration higher than that of the layer 9. Specifically, while the Ge concentration in the layer 9 is 12 to 13%, that in the P+-SiGe layer 14 is 17 to 18%.

FIGS. 5A to 5M illustrate specifically the process of fabricating the bipolar transistor shown in FIG. 4. The steps shown in FIGS. 5A to 5G are identical to those shown in FIGS. 1A to 1G. The Ge concentration in the SiGe layer 9 serving as the internal base layer is 12 to 13%, and the B concentration therein is about $1 \times 10^{19}/cm^3$.

A silicon oxide film 12 is deposited by means of CVD, and the film 12, except a portion corresponding to the emitter region, is removed by RIE with use of a photoresist mask (not shown). Subsequently, the N+-type silicon layer 11 is removed by etching, and part of the N-type silicon layer 10 is etched (FIG. 5H). The figures after FIG. 5H are enlarged views of important portions. A silicon oxide film 13 is deposited by means of CVD, and the film 13 is etched by RIE such that part of the film 13 is left on the side walls of the silicon oxide film 12 and silicon layers 10 and 11 of the emitter region. Using the silicon oxide films 12 and 13 as a mask, the N-type silicon layer 10 is removed by etching and then the P-type SiGe layer 9 is etched to a predetermined depth (FIG. 5I).

Figure 5D:
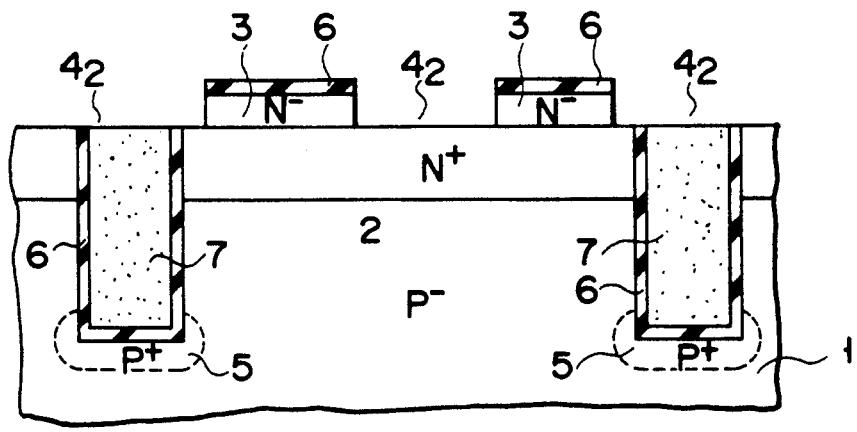
Figure 5E:
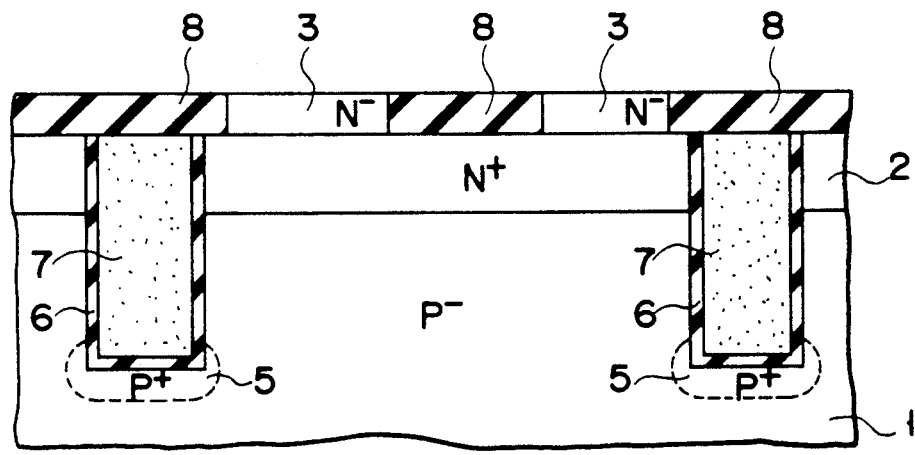
Figure 5F:
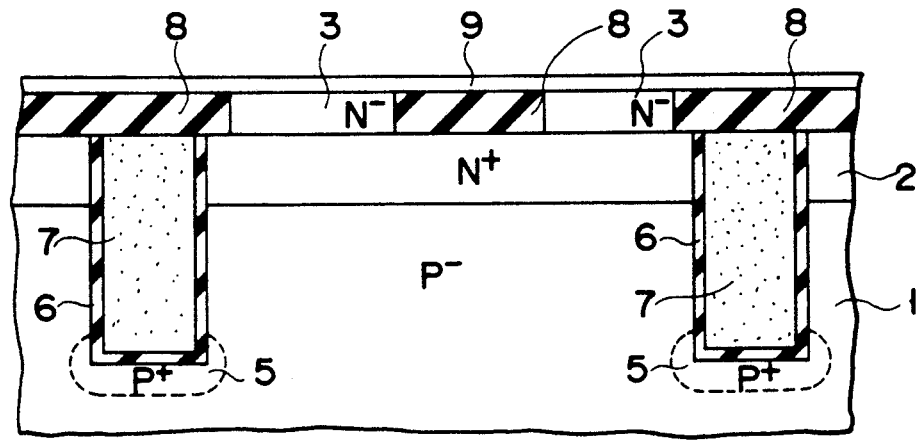
Figure 5J:
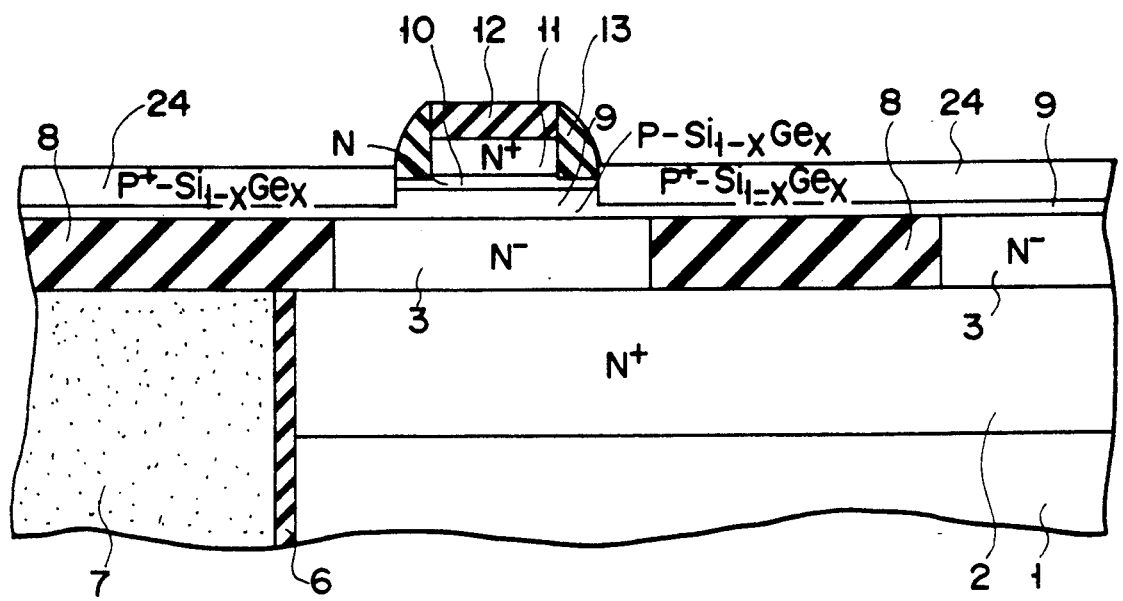
Figure 5K:
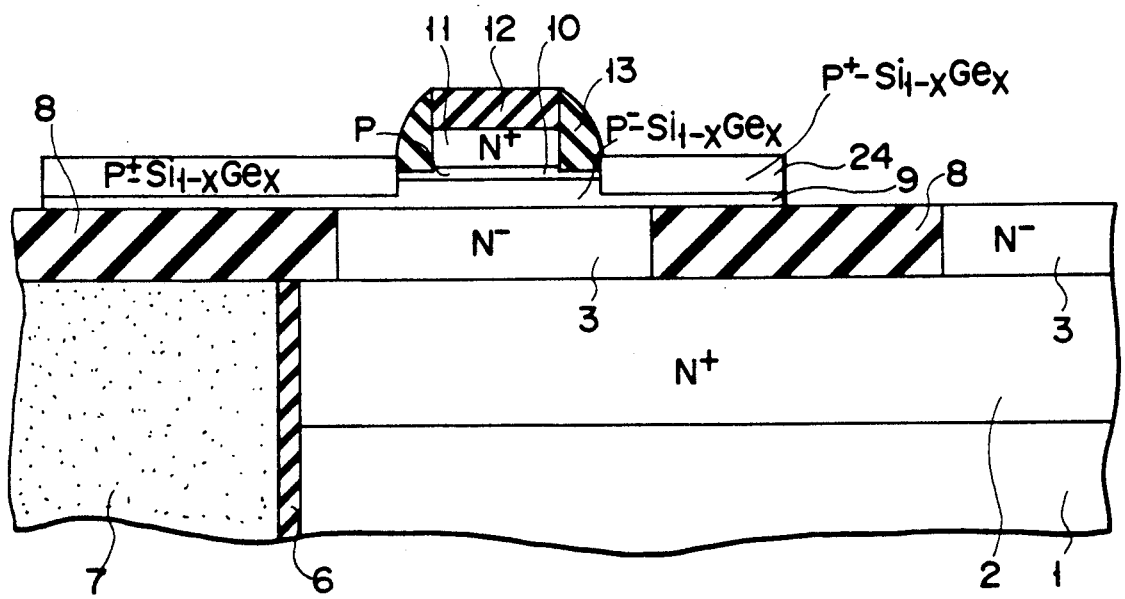

A P-type SiGe layer 24 having a higher Ge concentration than the P-type SiGe layer 9 is epitaxially grown on the remaining P-type SiGe layer 9 (FIG. 5J). This P-type SiGe layer 24 will form an external base layer and a base lead-out electrode continuous with the external base layer. The Ge concentration in the layer 24 is about 17 to 18%. The thickness of the P-type SiGe layer 24 is greater than that of the P-type SiGe layer 9 remaining, without being etched, under the emitter region as an internal base layer. Then, a photoresist mask (not shown) is formed so as to cover the emitter region, external base region and base lead-out electrode region. Using the photoresist mask, the SiGe layer 24 is etched, and the external base layer and the base lead-out electrode region are patterned (FIG. 5K).

Subsequently, a silicon oxide film 17 is deposited over the entire structure by means of CVD. A photoresist mask 25 is formed on the film 17. Using the mask 25, the silicon oxide film 17 is etched, thereby forming an opening in the collector lead-out region. Then, arsenic ions are implanted to form an N+-type layer 16 in the collector lead-out region (FIG. 5L). After the photoresist mask 25 is removed, the silicon oxide film 17 is etched to a predetermined thickness, and emitter, base and collector electrode openings 18, 19 and 20 are formed. Finally, emitter, base and collector metallic electrodes 21, 22 and 23 are formed (FIG. 5M).

Figure 6:
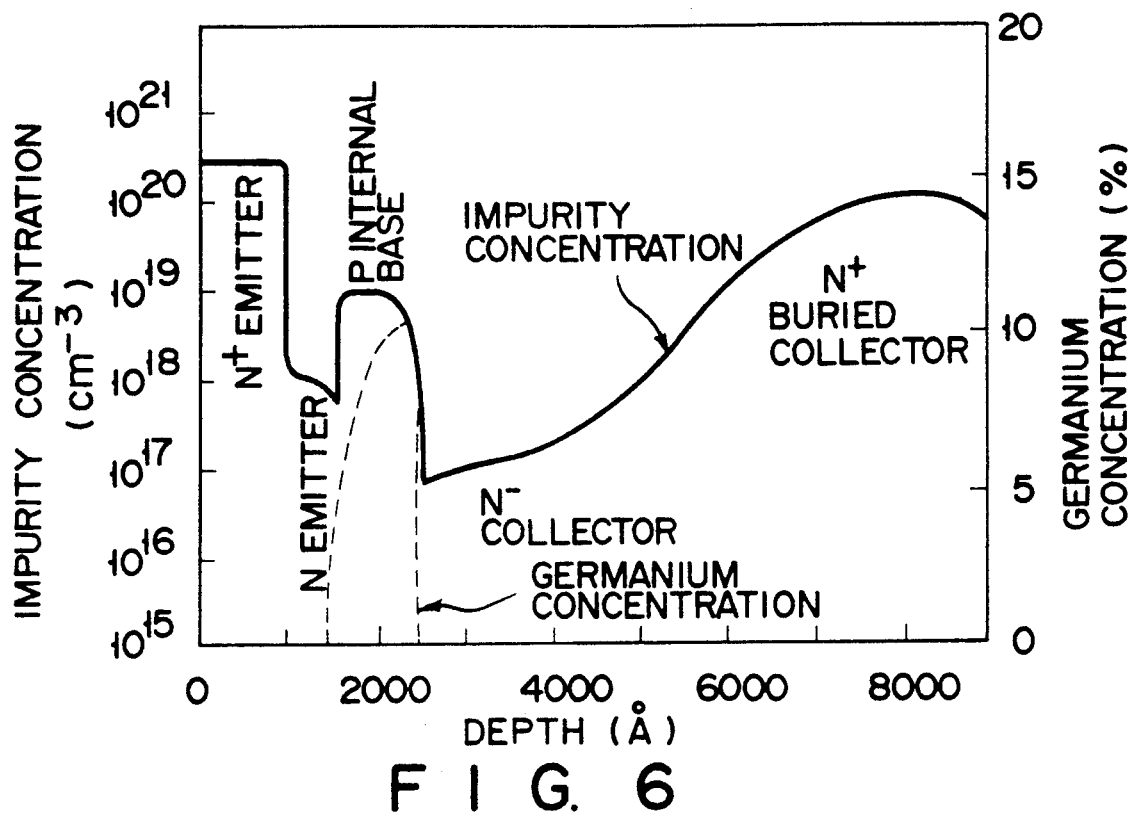
FIG. 6 is a graph showing an impurity concentration distribution and a Ge concentration distribution in a cross section taken along line A-A' in FIG. 4.
Figure 7:
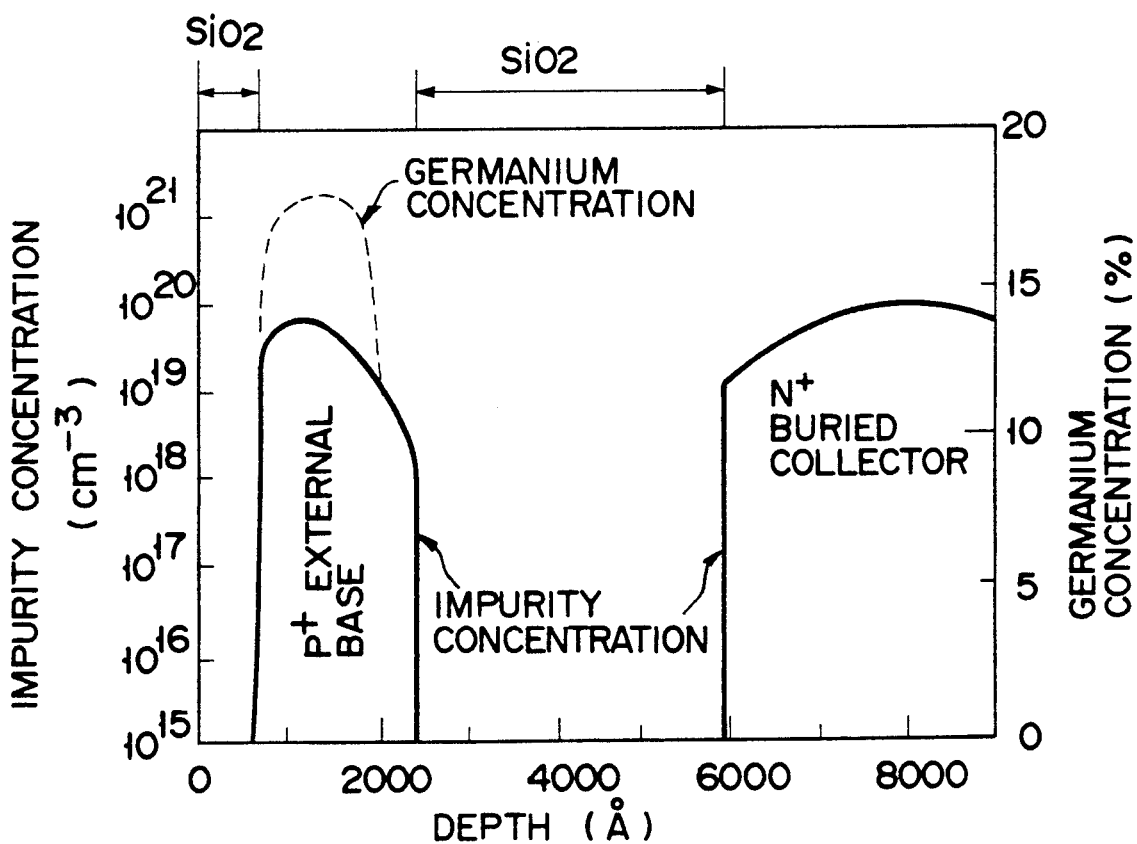
FIG. 7 is a graph showing an impurity concentration distribution and a Ge concentration distribution in a cross section taken along line B-B' in FIG. 4.

FIGS. 6 and 7 show an impurity concentration distribution and a Ge concentration distribution in the depth direction, respectively, in the emitter region (A-A' in FIG. 4) and the external base region (B-B' in FIG. 4) of the heterojunction bipolar transistor according to this embodiment.

According to this embodiment, regarding the base layer of the SiGe alloy, the Ge concentration of the external base layer is made higher than that of the internal base layer, and thereby the band gap of the external base layer is made less than that of the internal base layer. In addition, the thickness of the external base layer is made greater than that of the internal base layer. Accordingly, the resistance of the external base layer becomes sufficiently low, and the transistor of this embodiment can operate at a higher speed than that of the previously described embodiment. Moreover, like the previous embodiment, the oxide film is buried in the element isolating region prior to the epitaxial growth of the SiGe layer, so that the substrate is flattened and the base and emitter are formed on the flattened substrate. Therefore, the stepped portion on the surface is decreased, and the high reliability is attained.

FIG. 8 shows a heterojunction bipolar transistor according to still another embodiment of the present invention. The structural elements already described in each of the above embodiments are denoted by like reference numerals. The transistor shown in FIG. 8 differs from that shown in FIG. 1, in that the SiGe internal base layer comprises a first SiGe layer $9_1$ at the central part and a second SiGe layer $9_2$ at the peripheral part. The first SiGe layer $9_1$ and the second SiGe layer $9_2$ have different compositions. Specifically, the first SiGe layer $9_1$ has a higher Ge concentration than the second SiGe layer $9_2$, and accordingly the former has a smaller band gap. Like the above-described embodiments, the emitter layer comprises an N-type silicon layer 10 and an N+-type silicon layer 11.

Figure 9C:
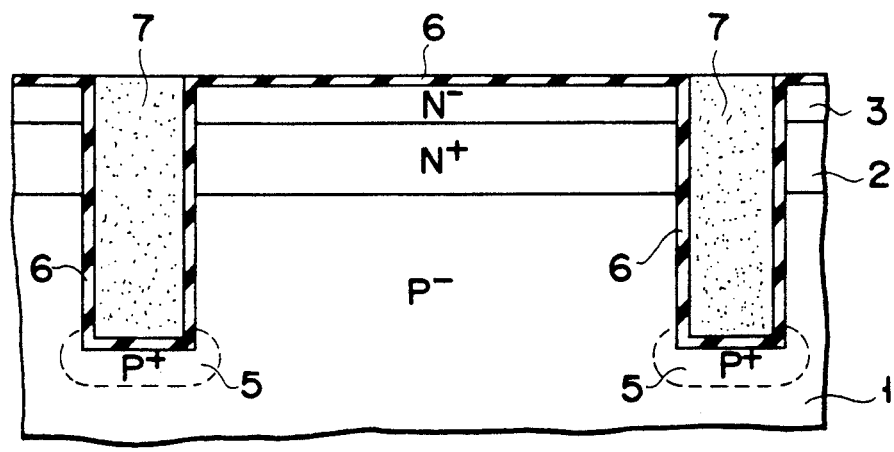
Figure 9D:
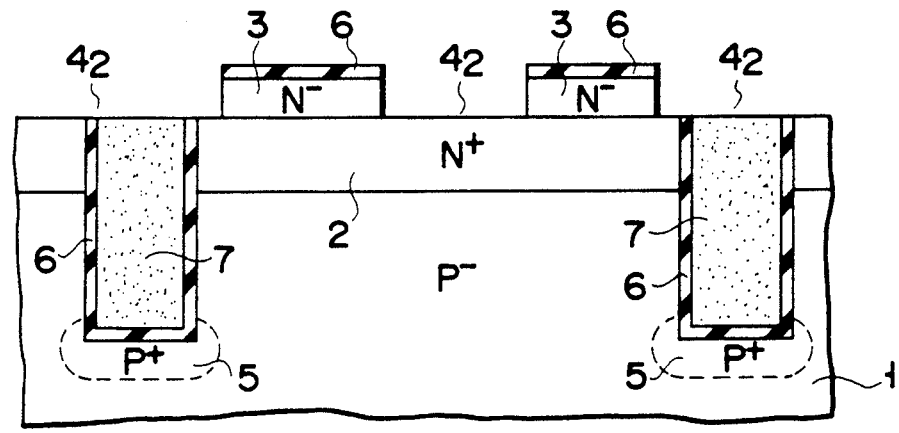
Figure 9E:
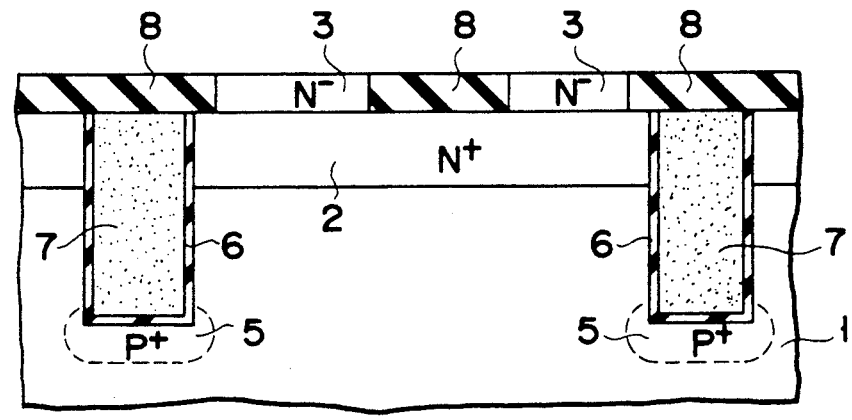
Figure 9F:
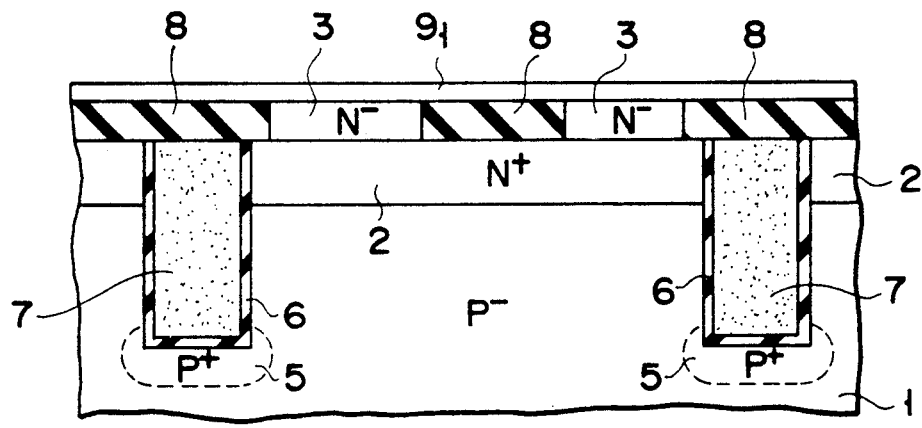
Figure 9G:
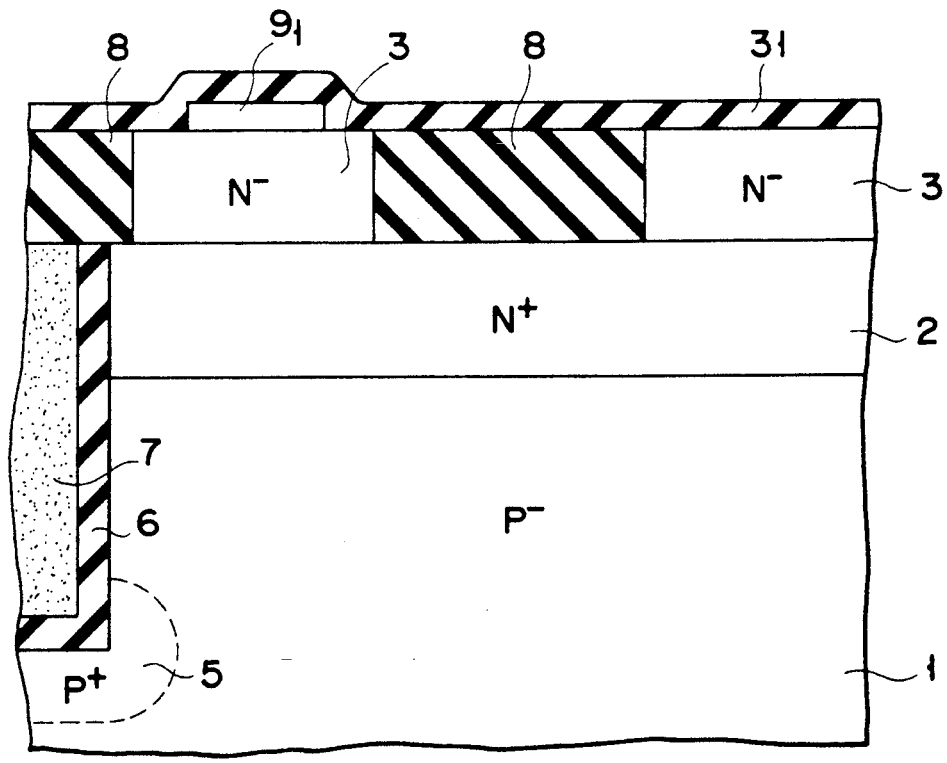

FIGS. 9A to 9M illustrate a specific process of fabricating the heterojunction transistor shown in FIG. 8. Since the steps shown in FIGS. 9A to 9D are common to those shown in FIGS. 1A to 1D, a description thereof may be omitted. In addition, the step of burying the silicon oxide film 8 in the groove $4_2$ to flatten the substrate is also commonly carried out. Therefore, the steps after this will now be described. A first SiGe layer $9_1$ containing 20% of Ge is epitaxially grown on the N−-type layer 3 by means of CVD. The first SiGe layer $9_1$ is removed, except a portion corresponding to the central region of the internal base, and then a silicon oxide film 31 is deposited over the resultant structure by means of CVD (FIG. 9G). Thereafter, a photoresist (not shown) is coated to flatten the entire structure, and the entire structure is subjected to reactive ion etching, thereby flattening the surface of the structure so as to be flush with the surface of the SiGe layer $9_1$. A silicon nitride film 32 is deposited by CVD and is selectively etched and patterned so as to cover the first SiGe layer $9_1$ and its peripheral internal base formation region (FIG. 9H).

Figure 9J:
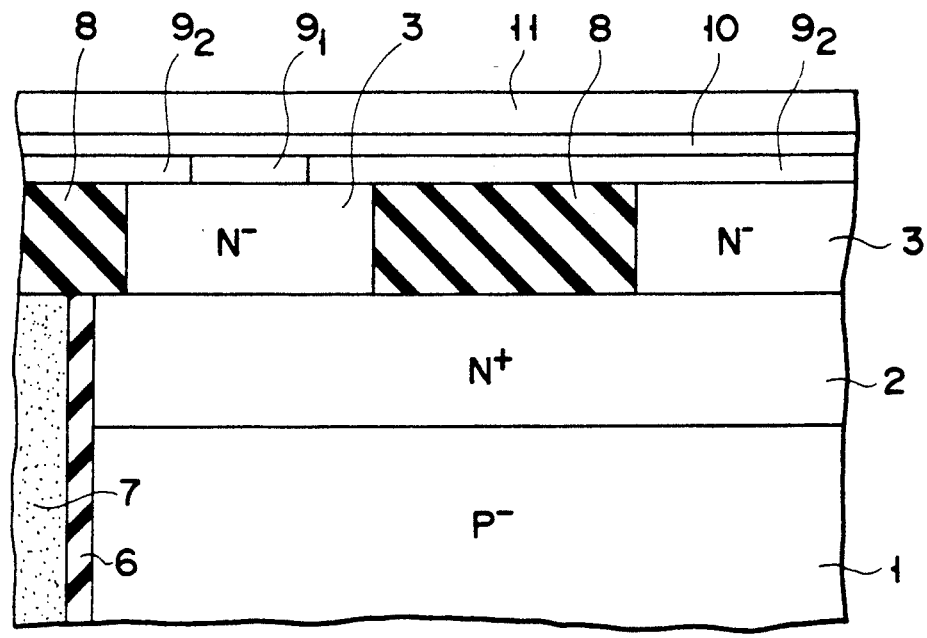
Figure 9K:
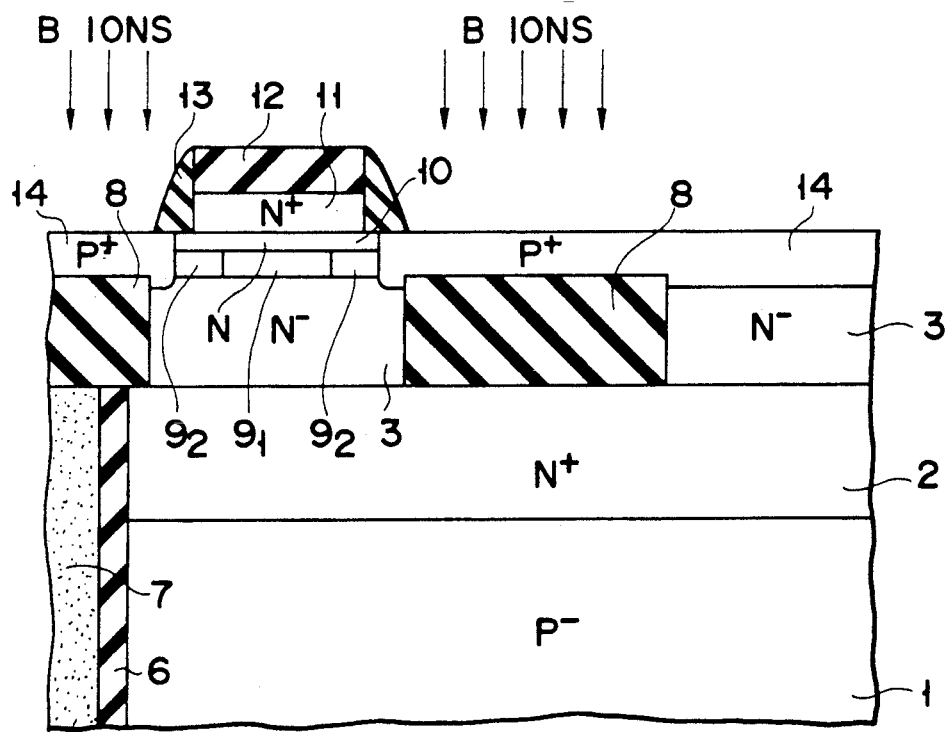

The silicon oxide film 31 is removed by wet etching. A second SiGe layer $9_2$ containing 10% of Ge is epitaxially grown once again by CVD (FIG. 9I). At this time, the side face of the first SiGe layer $9_2$ and the surface of the N−-type layer 3 serve as a seed of epitaxial growth, thus enabling the second SiGe layer $9_2$ to crystal-grow horizontally. Thereafter, the silicon nitride film 32 is etched and removed, and an N-type silicon layer 10 having a thickness of 500 Å and serving as an emitter layer and an N+-type silicon layer 11 having a thickness of 1000 Å and serving as an emitter-contact layer are epitaxially grown successively (FIG. 9J). A silicon oxide film 12 is deposited by CVD and is patterned so as to leave only a portion corresponding to the emitter region. Using the resultant oxide film 12 as a mask, the N+-type layer 11 is etched. A silicon oxide film 13 is deposited once again by means of CVD and is removed except the portion on the side wall of the oxide film 12 and the N+-type layer 11. Using the oxide films 12 and 13 as a mask, boron ions are implanted in the second SiGe film $9_2$, thereby forming a P+-type layer 14 serving as an external base layer with a depth reaching the N--type layer 3 (FIG. 9K).

The P+-type layer 14 is etched and removed, except portions corresponding to the external base region and the base electrode lead-out region. A photoresist mask 15 having an opening at the collector lead-out region is formed and As ions are implanted to form an N+-type diffusion layer 16 reaching the N+-type buried layer 2 (FIG. 9L). After the photoresist mask 15 is removed, a silicon oxide film 17 is deposited as in the above-described embodiments. The film 17 is selectively etched to form electrode openings. Thus, emitter, base and collector metallic electrodes 21, 22 and 23 are formed (FIG. 9M).

Figure 10:
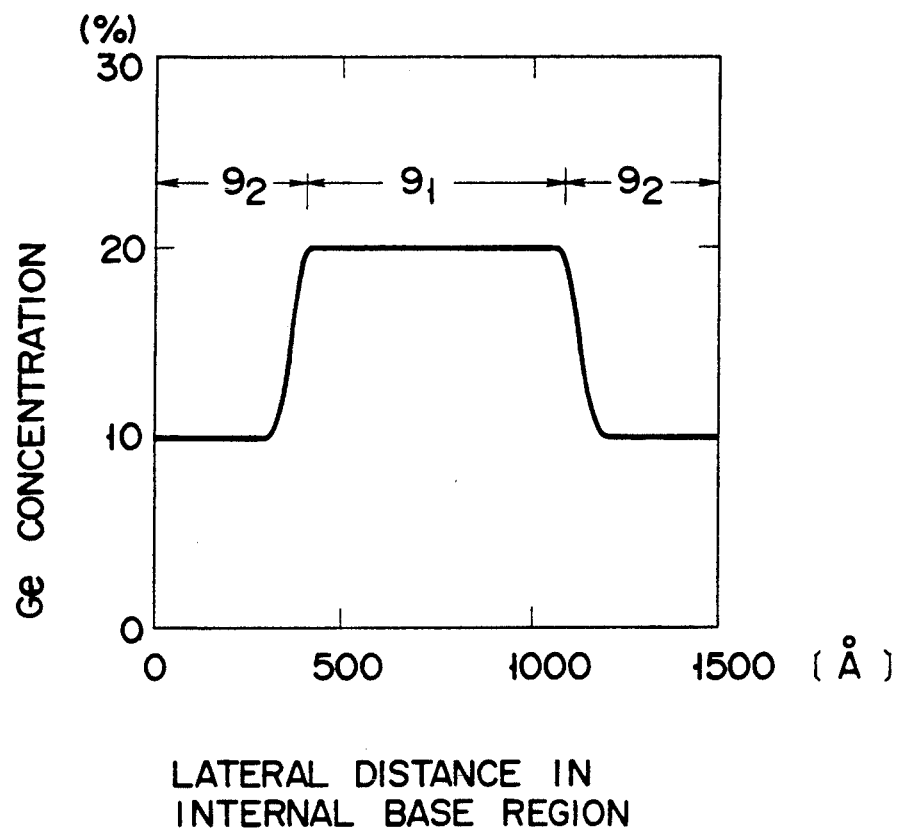
FIG. 10 is a graph showing a Ge concentration distribution in an internal base layer of the bipolar transistor of FIG. 8.

In the heterojunction bipolar transistor according to this embodiment, the SiGe internal base layer has different Ge concentrations at the central part $9_1$ and peripheral part $9_2$, as is illustrated in FIG. 10. Accordingly, the central part of the internal base layer has a higher Ge concentration and has a narrower band gap. The central part of the internal base layer has a lower resistance, and the barrier of the emitter junction is lower at the central part of the internal base layer than at the peripheral part thereof. As a result, in the operation with a high collector current density, a base push-out effect and a current concentration at the internal base can be suppressed, and a high performance of the transistor can be attained. Prior to the epitaxial growth of the base layer, the substrate is flattened by forming the groove in the element isolating region and burying the oxide film therein. Thus, the stepped portion can be decreased and high reliability can be obtained, as in the above-described embodiments.

In FIG. 9G, the SiGe layer $9_1$ is epitaxially grown and is patterned, after which the silicon oxide film 31 is formed. The step of epitaxially growing the SiGe layer $9_1$ and the step of forming the silicon oxide film 31 can be interchanged.

FIGS. 11A and 11B show the steps in this case. After the N--type silicon layer 3 is patterned and the substrate is flattened by the silicon oxide film 8, the silicon oxide film 31 is deposited. Using the photoresist mask 33, the silicon oxide film 31 is selectively etched, thereby forming an opening at the central part of the internal base region (FIG. 11A). After the photoresist mask 33 is removed, a first SiGe layer $9_1$ is epitaxially grown on the exposed surface of the N--type silicon layer 3 by means of CVD. The thickness of the SiGe layer $9_1$ is substantially the same as that of the silicon oxide film 31. Thereafter, as in the above-described embodiments, a silicon nitride film 32 is patterned over the internal base formation region covering the SiGe layer $9_1$. After the silicon oxide film 31 is etched and removed, a second SiGe layer $9_2$ is epitaxially grown (FIG. 11B). By this process, the same structure as in the above-described embodiments can be obtained.

Figure 12:
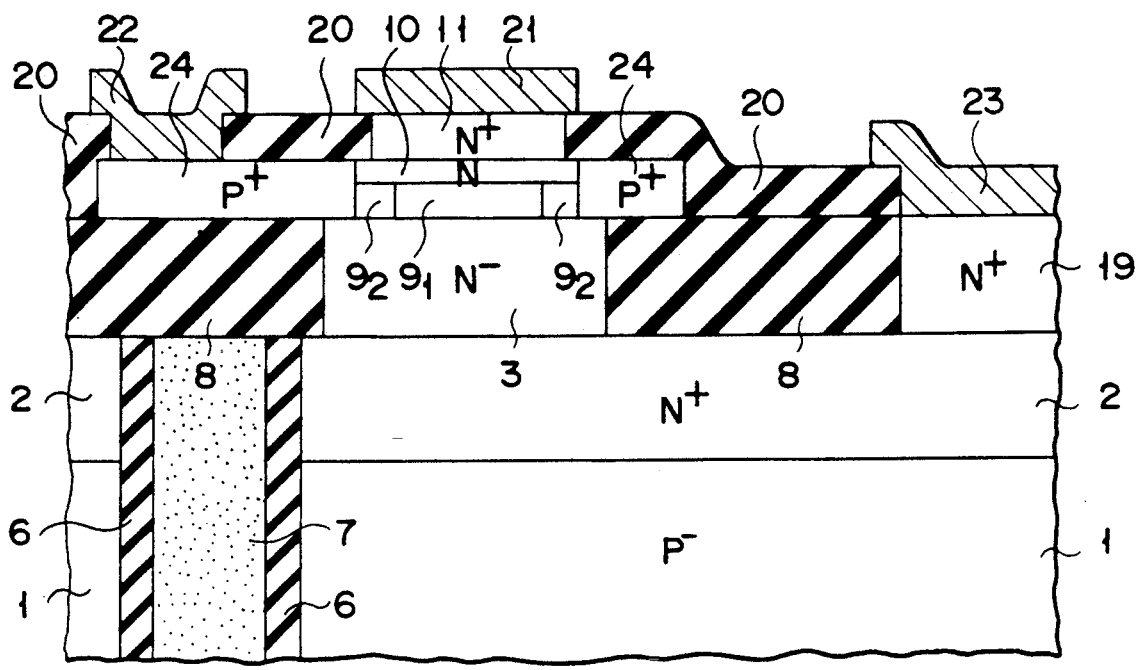
FIG. 12 is a cross-sectional view showing a heterojunction bipolar transistor according to still another embodiment of the invention.

FIG. 12 shows a heterojunction transistor according to a third embodiment of the present invention. In this embodiment, both an active base region and an external base region are formed of SiGe layers. Specifically, a central part of the active base region is formed of a first SiGe layer 91, a peripheral part of the active base region is formed of a second SiGe layer $9_2$, and an external base region is formed of a third SiGe layer 24. The band gap of the first SiGe layer $9_1$ is greater than that of the third SiGe layer 24, and the band gap of the second SiGe layer $9_2$ is greater than that of the first SiGe layer $9_1$.

The structure of the third embodiment is obtained in the following manner. First, like the above-described embodiments, an N--type silicon layer 3 is epitaxially grown on a P--type silicon substrate 1, with an N+-type embedded layer 2 interposed. A first groove for isolating an element is formed, and a silicon oxide film 6 is formed in the groove. Thereafter, an undoped polycrystalline silicon layer 7 is buried to flatten the resultant structure. The N--type layer 3 is etched to form a second groove, except those portions which correspond to the emitter region, base region and collector lead-out region. Then, a CVD silicon oxide film 8 is buried in the second groove. Subsequently, SiGe layers are deposited and patterned repeatedly, so that the internal base region and the external base region are formed of the first, second and third SiGe layers $9_1$, $9_2$ and 24 having different Ge contents. The Ge contents decrease in the order of the third SiGe layer 24, the first SiGe layer $9_1$, and the second SiGe layer $9_2$. In the subsequent process, as in the above-described embodiments, an emitter layer is formed, a collector lead-out layer is formed, and electrodes 21, 22 and 23 are formed. Thus, the fabrication of the transistor of the third embodiment is completed.

Figure 13:
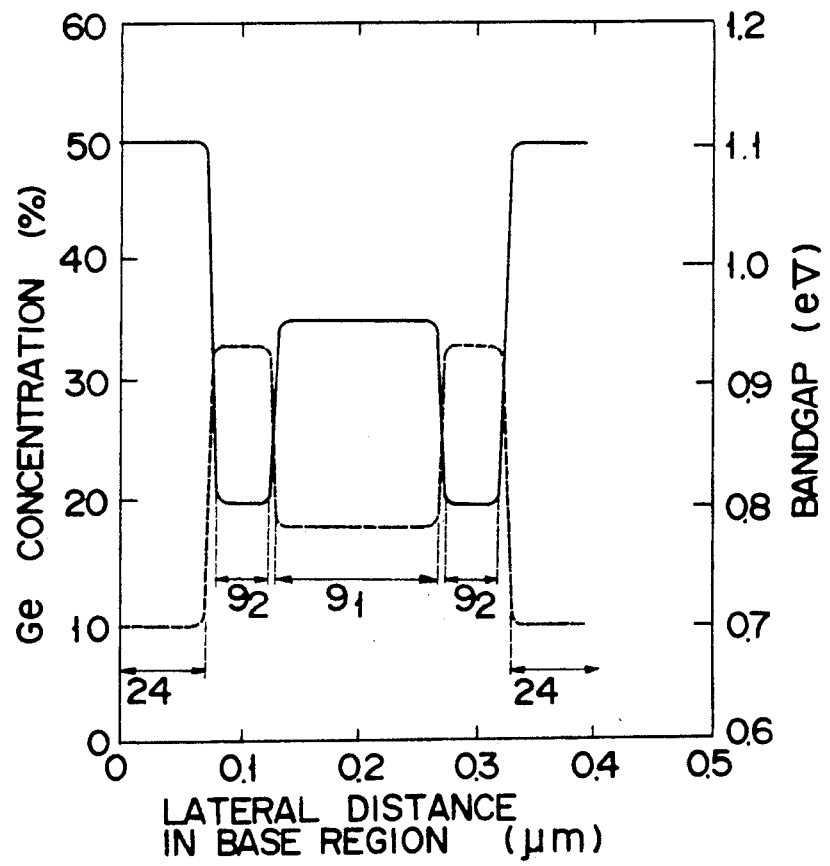
FIG. 13 is a graph showing a Ge concentration distribution and a band gap distribution in the base region of the bipolar transistor of FIG. 12.

FIG. 13 shows a Ge content distribution and a band gap distribution in the external base region and the internal base region in the heterojunction bipolar transistor according to the third embodiment. Specifically, in FIG. 13, the Ge content of the first SiGe layer $9_1$ at the central part of the internal based region is 35%, the Ge content of the second SiGe layer $9_2$ at the peripheral part of the internal base region is 20%, and the Ge content of the third SiGe layer 24 at the external base region is 50%.

According to the third embodiment, the advantages of both the above-described two embodiments can be obtained.

The present invention is not limited to the above-described embodiments. For example, in the above embodiments, the Ge concentration in the SiGe layer serving as the base layer is changed only in the horizontal direction; however, it is possible and advantageous to change the Ge concentration in the depth direction. For example, in FIG. 6, the Ge concentration in the internal base layer is lower at the emitter side and higher at the collector side; however, in the embodiment of FIG. 1 or FIG. 8, the internal base layer may have a similar distribution of Ge concentration. In this case, the band gap of the internal base layer becomes greater at the emitter side than at the collector side. In other words, an electric field for accelerating electrons injected from the emitter is generated in the internal base layer. Thus, the switching of the transistor can be performed at a still higher speed.

In the embodiments, the silicon-based heterojunction bipolar transistor has been employed; however, this invention is effective even if other semiconductors are combined. For example, AlGaAs may be used for the emitter and collector, and GaAs may be used for the base.

Furthermore, in the embodiments, heterojunctions are employed both in the emitter junction and in the collector junction; however, this invention is effective even if the heterojunction is employed only in either the emitter junction or the collector junction. For example, a SiGe layer may be used as the collector layer and the base layer, and a Si layer may be used as the emitter layer. Alternatively, a SiGe layer may be used as the emitter layer and the base layer, and a Si layer may be used as the collector layer.

Additional advantages and modifications will readily occur to those skilled in the art. Therefore, the invention in its broader aspects is not limited to the specific details, devices, and illustrated examples shown and described herein. Accordingly, various modifications may be without departing from the spirit or scope of the general inventive concept as defined by the appended claims and their equivalents.

What is claimed is:

1. A method of fabricating a miniaturized heterojunction bipolar transistor wherein at least one of an emitter layer and a collector layer is formed of a semiconductor material having a wider band gap than a material of a base layer, said method comprising the steps of:

forming a first silicon layer of a first conductivity type on a substrate, said first silicon layer serving as a collector layer;

etching a selected portion of the first silicon layer to form a groove which defines an area of said collector layer, and burying an insulating layer in said groove, said insulating layer having a top surface being substantially flush with that of said first silicon layer;

forming a silicon-germanium alloy layer of a second conductivity type, serving as a base layer, on the first silicon layer and that part of the insulating layer surrounding the first silicon layer;

forming a second silicon layer of the first conductivity type, serving as an emitter layer, on the silicon-germanium alloy layer; and selectively doping an impurity of the second conductivity type into said base layer, said emitter layer and said collector layer, thereby to provide a heavily-doped layer serving as an external base layer, said external base layer having opposing edge portions between which the emitter and base layers are located and a distance between which is smaller than a width of said collector layer.

2. The method of fabricating a miniaturized heterojunction bipolar transistor, according to claim 1, further comprising a step of burying a field insulating layer after the step of forming the first silicon layer.

3. The method of fabricating a miniaturized heterojunction bipolar transistor, according to claim 1, wherein said substrate is formed of silicon, and said insulating layer buried in the groove is a CVD silicon oxide layer.

4. The method of fabricating a miniaturized heterojunction bipolar transistor, according to claim 3, wherein said silicon-germanium alloy layer has such a germanium concentration distribution in the thickness direction that the germanium concentration decreases towards the emitter side.

5. A method of fabricating a miniaturized heterojunction bipolar transistor wherein at least one of an emitter layer and a collector layer is formed of a semiconductor material having a wider band gap than a material of a base layer, said method comprising the steps of:

forming a first silicon layer of a first conductivity type on a substrate, said first silicon layer serving as a collector layer;

etching an unnecessary portion of the first silicon layer to form a groove, and burying a first insulating layer in said groove;

epitaxially growing a silicon-germanium alloy layer of a second conductivity type, serving as a base layer, on the first silicon layer and that part of the first insulating layer surrounding the first silicon layer;

forming successively a second silicon layer of the first conductivity type, which will become an emitter layer, and a third silicon layer of the first conductivity type, which will become an emitter-contact layer, on the surface of the silicon-germanium alloy layer;

patterning a second insulating layer on the third silicon layer so as to cover the emitter region, and, using the second insulating layer as a mask, etching and removing the third silicon layer;

selectively forming a third insulating layer on a side wall of a laminated structure of the third silicon layer and the second insulating layer; and doping an impurity in the silicon-germanium alloy layer and the second silicon layer, with the second and third insulating layers used as a mask, thereby forming an external base layer of the second conductivity type.

6. The method of fabricating a miniaturized heterojunction bipolar transistor, according to claim 5, further comprising a step of burying a field insulating layer after the step of forming the first silicon layer.

7. The method of fabricating a miniaturized heterojunction bipolar transistor, according to claim 6, wherein said substrate if formed of silicon, and said first insulating layer buried in the groove is a CVD silicon oxide layer.

8. The method of fabricating a miniaturized heterojunction bipolar transistor, according to claim 7, wherein said silicon-germanium alloy layer has such a germanium concentration distribution in the thickness direction that the germanium concentration decreases towards the emitter side.

9. A method of fabricating a miniaturized heterojunction bipolar transistor wherein at least one of an emitter layer and a collector layer is formed of a semiconductor material having a wider band gap than a material of a base layer, said method comprising the steps of:

forming a first silicon layer of a first conductivity type on a substrate, said first silicon layer serving as a collector layer;

etching an unnecessary portion of the first silicon layer to form a groove, and burying a first insulating layer in said groove;

epitaxially growing a first silicon-germanium alloy of a second conductivity type, serving as a base layer, on the first silicon layer and that part of the insulating layer surrounding the first silicon layer;

forming successively a second silicon layer of the first conductivity type, which will become an emitter layer, and a third silicon layer of the first conductivity type, which will become an emitter-contact layer, on the surface of the first silicon-germanium alloy layer;

patterning a second insulating layer on the third silicon layer so as to cover the emitter region, and, using the second insulating layer as a mask, etching and removing the third silicon layer;

selectively forming a third insulating layer on a side wall of a laminated structure of the third silicon layer and the second insulating layer;

etching and removing the second silicon layer, with the second and third insulating layers used as a mask, and subsequently etching the first silicon-germanium alloy layer to a predetermined thickness;

epitaxially growing a second silicon-germanium alloy layer serving as an external base layer on the remaining first silicon-germanium alloy layer, said second silicon-germanium alloy layer having a narrower band gap than the first silicon-germanium alloy layer and a greater thickness than the first silicon-germanium alloy layer; and doping an impurity in the second silicon-germanium alloy layer, thereby forming an external base layer of the second conductivity type.

10. The method of fabricating a miniaturized heterojunction bipolar transistor, according to claim 9, further comprising a step of burying a field insulating layer after the step of forming the first silicon layer.

11. The method of fabricating a miniaturized heterojunction bipolar transistor, according to claim 10, wherein said substrate is formed of silicon, said second silicon-germanium alloy layer has a higher germanium concentration than the first silicon-germanium alloy layer, and said insulating layer buried in the groove is a CVD silicon oxide layer.

12. The method of fabricating a miniaturized heterojunction bipolar transistor, according to claim 11, wherein said first silicon-germanium alloy layer has such a germanium concentration distribution in the thickness direction that the germanium concentration decreases towards the emitter side.

13. A method of fabricating a miniaturized heterojunction bipolar transistor wherein at least one of an emitter layer and a collector layer is formed of a semiconductor material having a wider band gap than a material of a base layer, said method comprising the steps of:

forming a first silicon layer of a first conductivity type on a substrate, said first silicon layer serving as a collector layer;

etching an unnecessary portion of the first silicon layer to form a groove, and burying a first insulating layer in said groove;

epitaxially growing a first silicon-germanium alloy layer of a second conductivity type, serving as a first internal base layer, on the first silicon layer and that part of the insulating layer surrounding the first silicon layer, and patterning the first silicon-germanium alloy layer so as to leave the first silicon-germanium alloy layer at a central part of an internal base region;

epitaxially growing a second silicon-germanium alloy layer serving as a second internal base layer continuous with the periphery of said patterned first silicon-germanium alloy layer, said second silicon-germanium alloy layer having a narrower band gap than the first silicon-germanium alloy layer;

forming successively a second silicon layer of the first conductivity type, which will become an emitter layer, and a third silicon layer of the first conductivity type, which will become an emitter-contact layer, on the surfaces of the first and second silicon-germanium alloy layers;

patterning a second insulating layer on the third silicon layer so as to cover the emitter region, and, using the second insulating layer as a mask, etching and removing the third silicon layer;

selectively forming a third insulating layer on a side wall of a laminated structure of the third silicon layer and the second insulating layer; and doping an impurity in the second silicon-germanium alloy layer and the second silicon layer, with the second and third insulating layers used as a mask, thereby forming an external base layer of the second conductivity type.

14. The method of fabricating a miniaturized heterojunction bipolar transistor, according to claim 13, further comprising a step of burying a field insulating layer after the step of forming the first silicon layer.

15. The method of fabricating a miniaturized heterojunction bipolar transistor, according to claim 14, wherein said substrate is formed of silicon, said second silicon-germanium alloy layer has a higher germanium concentration than the first silicon-germanium alloy layer, and said insulating layer buried in the groove is a CVD silicon oxide layer.

16. The method of fabricating a miniaturized heterojunction bipolar transistor, according to claim 15, wherein said first silicon-germanium alloy layer has such a germanium concentration distribution in the thickness direction that the germanium concentration decreases towards the emitter side.

* * * * *